(12) United States Patent
Sonobe et al.

(10) Patent No.: US 7,426,111 B2
(45) Date of Patent: Sep. 16, 2008

(54) COMMUNICATION APPARATUS AND RACK STRUCTURE

(75) Inventors: Hideki Sonobe, Kawasaki (JP); Kazuo Hirafuji, Kawasaki (JP); Yoshihisa Nakagawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/798,310

(22) Filed: May 11, 2007

(65) Prior Publication Data

US 2007/0258211 A1 Nov. 8, 2007

Related U.S. Application Data

(63) Continuation of application No. PCT/JP2004/017017, filed on Nov. 16, 2004.

(51) Int. Cl.
*H05K 7/20* (2006.01)
(52) U.S. Cl. .................... 361/695; 361/694; 454/184
(58) Field of Classification Search ......... 361/687–690, 361/694–695; 454/184
See application file for complete search history.

(56) References Cited

U.S. PATENT DOCUMENTS

| | | | | |
|---|---|---|---|---|
| 4,774,631 A | * | 9/1988 | Okuyama et al. | 361/695 |
| 5,105,336 A | * | 4/1992 | Jacoby et al. | 361/690 |
| 5,136,464 A | * | 8/1992 | Ohmori | 361/694 |
| 5,414,591 A | * | 5/1995 | Kimura et al. | 361/695 |
| 5,493,474 A | * | 2/1996 | Schkrohowsky et al. | 361/695 |
| 5,544,012 A | * | 8/1996 | Koike | 361/695 |
| 6,927,980 B2 | * | 8/2005 | Fukuda et al. | 361/700 |
| 7,182,208 B2 | * | 2/2007 | Tachibana | 211/26 |
| 7,245,485 B1 | * | 7/2007 | Morrell | 361/687 |

FOREIGN PATENT DOCUMENTS

| | | |
|---|---|---|
| JP | 56-105700 | 8/1981 |
| JP | 59-95689 | 6/1984 |

OTHER PUBLICATIONS

Patent Abstract of Japan, Japanese Publication No. 08-167784, Published Jun. 25, 1996.
Patent Abstract of Japan, Japanese Publication No. 07-058471, Published Mar. 3, 1995.
Patent Abstract of Japan, Japanese Publication No. 2003-218572, Published Jul. 31, 2003.
Patent Abstract of Japan, Japanese Publication No. 04-115599, Published Apr. 16, 1992.

* cited by examiner

*Primary Examiner*—Gregory D Thompson
(74) *Attorney, Agent, or Firm*—Staas & Halsey LLP

(57) ABSTRACT

A rack structure which is capable of improving heat-dissipating efficiency thereof within a limited space, and a communication apparatus which is capable of enhancing cooling efficiency by applying the rack structure thereto. In the rack structure of the communication apparatus, the air used for cooling printed circuit boards within a lower shelf and thereby increased in temperature is cooled by causing the same to flow through the heat-dissipating duct on a lateral side and is then used again for cooling printed circuit boards within an upper shelf. This makes it possible to increase the heat-dissipating efficiency of the communication apparatus to thereby improve the cooling performance thereof. As a consequence, the necessity of increasing the number of cooling fans or increasing the size of fans becomes small, and the cooling performance of the communication apparatus can be maintained within a limited installation space. Further, the necessity of increasing the rotational speed of fans and the like becomes small, and it is possible to avoid the problem of noise and the like.

28 Claims, 19 Drawing Sheets

FIG. 12A  FIG. 12B  FIG. 12C
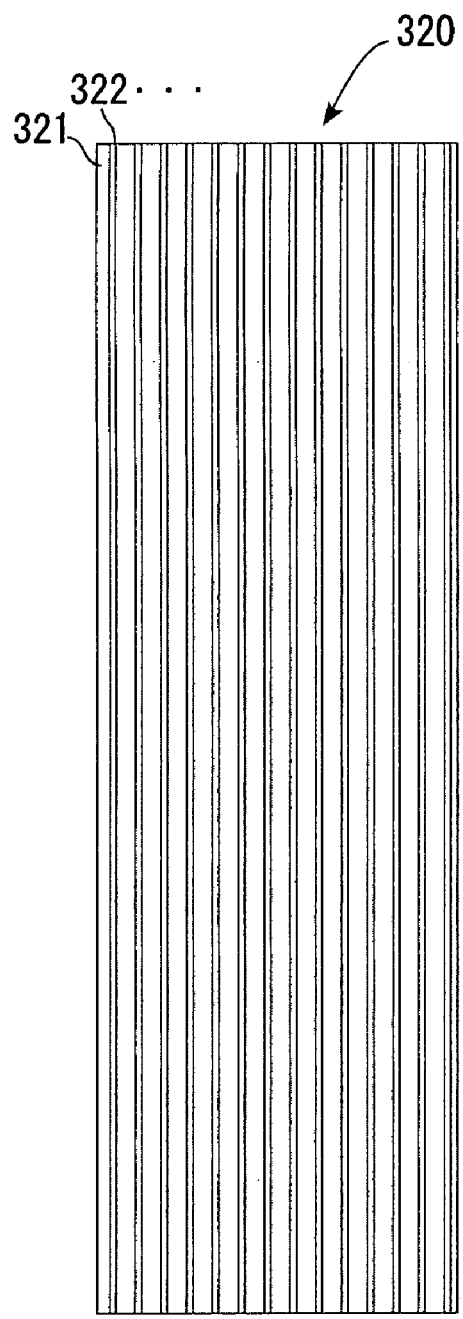
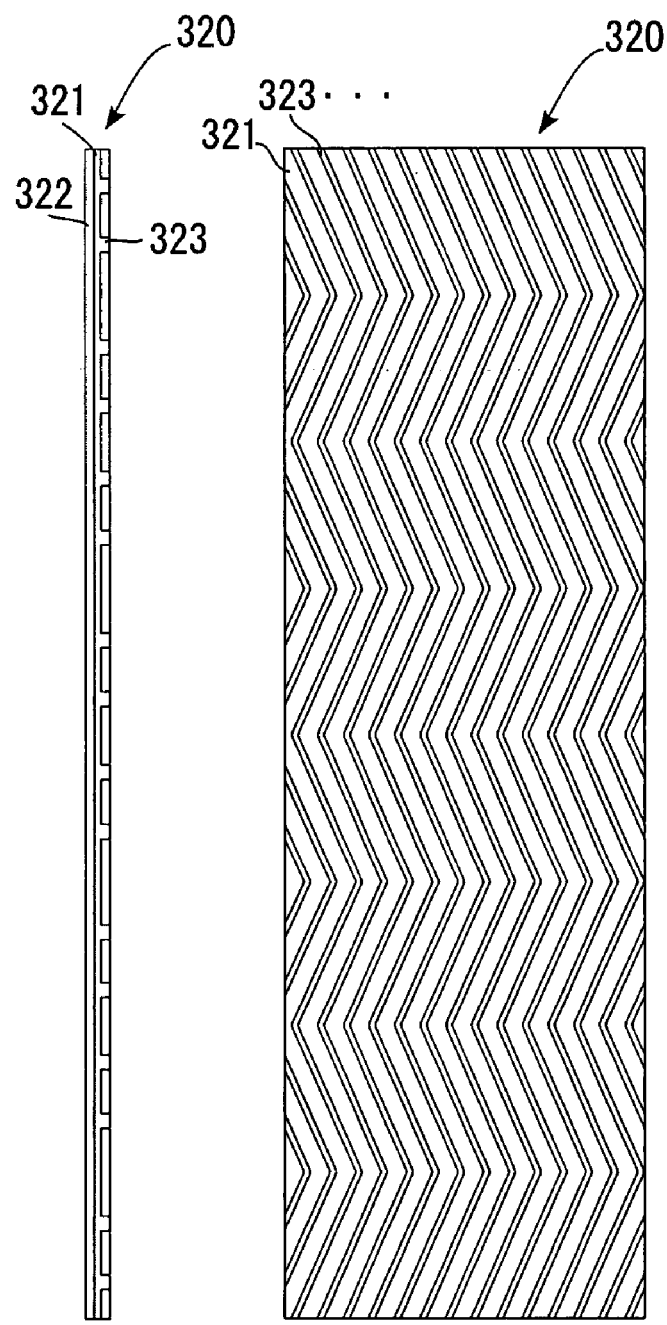

COMMUNICATION APPARATUS AND RACK STRUCTURE

This application is a continuing application, filed under 35 U.S.C. §111(a), of International Application PCT/JP2004/017017, filed Nov. 16, 2004.

BACKGROUND OF THE INVENTION (1) Field of the Invention

The present invention relates to a rack structure that includes a plurality of shelves arranged vertically each for accommodating a plurality of printed circuit boards on which electronic devices are mounted, parallel to each other, and more particularly to a rack structure that is configured to cool printed circuit boards by forced ventilation using fans, and a communication apparatus employing the rack structure.

(2) Description of the Related Art

A conventional communication apparatus is constructed by vertically arranging a plurality of shelves for accommodating a plurality of printed circuit boards on which electronic devices are mounted, parallel to each other, and is installed e.g. in a base transceiver station. The electronic devices include heat-producing elements. Therefore, fans or the like are provided between vertically adjacent ones of the shelves to form a ventilation structure for cooling (e.g. Japanese Unexamined Patent Publication No. 8-167784.

FIG. 17 is a perspective view of an example of the construction of such a conventional communication apparatus 101, and FIG. 18 is an exploded perspective view of the communication apparatus. Further, FIG. 19 is a cross-sectional view taken on line A-A of FIG. 17, and arrows represent flows of air by forced ventilation.

As shown in FIG. 17, the communication apparatus 101 is constructed by arranging shelves 103, 104, and 105, fans 106, 107, and 108, and heat shield plates 109 and 110, etc. within a rack 102 comprising a frame formed by welding sheet metal components.

As shown in FIG. 18, the shelves 103 to 105 accommodate a plurality of printed circuit boards 111, 112, and 113, on which electronic devices are mounted, parallel to each other, and these printed circuit boards are mounted on a mother board 114 provided on each shelf and have electrical functions.

As shown in FIG. 19, the shelf 103 is cooled by forced ventilation by the fan 106, and on the other hand, a heat shield plate 109 is arranged between the two shelves 103 and 104, for preventing exhaust heat from heating the shelf 104 disposed immediately above. The heat shield plate 109 has a partition plate 115 for diagonally partitioning between a lower exhaust passage for exhausting warm air exhausted from the shelf 103 via the fan 106, to the rear side, and an upper introduction passage for passing outside air from the front side into the shelf 104, and is arranged such that the heat shield plate 109 covers the fan 106 from above. When the fan 106 disposed above the shelf 103 is driven, outside air is drawn up from below, and the air for cooling circulates through the shelf 103 to cool the printed circuit boards 111 disposed therein. At this time, although the air used for cooling is increased in temperature by heat exchange occurring when cooling the printed circuit boards 111, it is exhausted to the outside of the apparatus after flowing along the partition plate 115 of the heat shield plate 109. Therefore, the warmed air does not adversely affect the shelves 104 and 105 disposed above.

Further, the shelf 104 is also cooled by forced ventilation by the fan 107, and so as to prevent the exhaust heat from heating the shelf 105 disposed immediately above, a heat shield plate 110 is disposed between the shelves 104 and 105. Then, outside air is drawn into the upper introduction passage of the heat shield plate 109, and the air for cooling circulates through the shelf 104 to cool the printed circuit boards 112 disposed therein. At this time, the air used for cooling is increased in temperature by heat exchange, and flows along the partition plate 115 of the heat shield plate 110 to be discharged to the rear side of the apparatus.

Further, in the shelf 105 as well, air is drawn into the upper introduction passage of the heat shield plate 110 from the front by forced ventilation by the fan 108, and the air for cooling circulates through the shelf 105 to cool the printed circuit boards 113 disposed therein. At this time, the air used for cooling is increased in temperature by heat exchange, and is delivered from the fan 108 to be exhausted from an opening formed in an upper end of the apparatus.

By the way, recently, the communication apparatus described above requires larger capacity and larger output, and accordingly, the number of printed circuit boards accommodated therein increases to increase electric power consumption. Therefore, to maintain the heat-dissipating efficiency of the apparatus, countermeasures have conventionally been taken e.g. by increasing the number of fans disposed in the rack, employing highly efficient fans having large outside dimensions, and increasing the rotational speed of fans.

However, in actuality, the dimensions of the rack of the communication apparatus are limited such that the apparatus can be installed in a specified installation space, and hence it is impossible to easily increase the number of fans, or increase the dimensions of fans, which makes it very difficult to secure the cooling performance. Further, an increase in the rotational speed of fans causes another problem of increased noise.

SUMMARY OF THE INVENTION

The present invention has been made in view of these problems, and an object thereof is to provide a rack structure which is capable of improving heat-dissipating efficiency thereof in a limited space, and a communication apparatus which is capable of enhancing cooling efficiency by applying the rack structure thereto.

To attain the above object, there is provided a rack structure formed by arranging a plurality of shelves at respective stages within a rack, each shelf accommodating a plurality of printed circuit boards having electronic components mounted thereon, parallel to each other, in a box-shaped body thereof having openings in a top and a bottom thereof, and disposing, between the shelves, fans each for causing forced ventilation of air from the opening in the bottom to the opening in the top of the shelf immediately below, and heat shield plates each for blocking air delivered from the fan from entering an inside of the shelf immediately above and guiding delivery of the air. The rack structure includes heat-dissipating walls arranged at sides of the rack which are opposite to air delivery openings of the heat shield plates, each heat-dissipating wall having a plurality of fins extending vertically, and forming heat-dissipating ducts which extend vertically, between grooves formed between adjacent ones of the fins and associated side walls of the shelves.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIGS. 3A, 3B, and 3C are explanatory views of the structure of a heat-dissipating wall as a component of a rack structure, wherein FIG. 3A is a front view thereof, FIG. 3B a plan view thereof, and FIG. 3C a side view.

FIGS. 12A, 12B, and 12C are explanatory views of the structure of a heat-dissipating wall as a component of a rack structure of the communication apparatus.

DETAILED DESCRIPTION OF PREFERRED EMBODIMENT

Hereinafter, embodiments of the present invention will be described in detail with reference to the drawings.

First Embodiment

Figure 1:
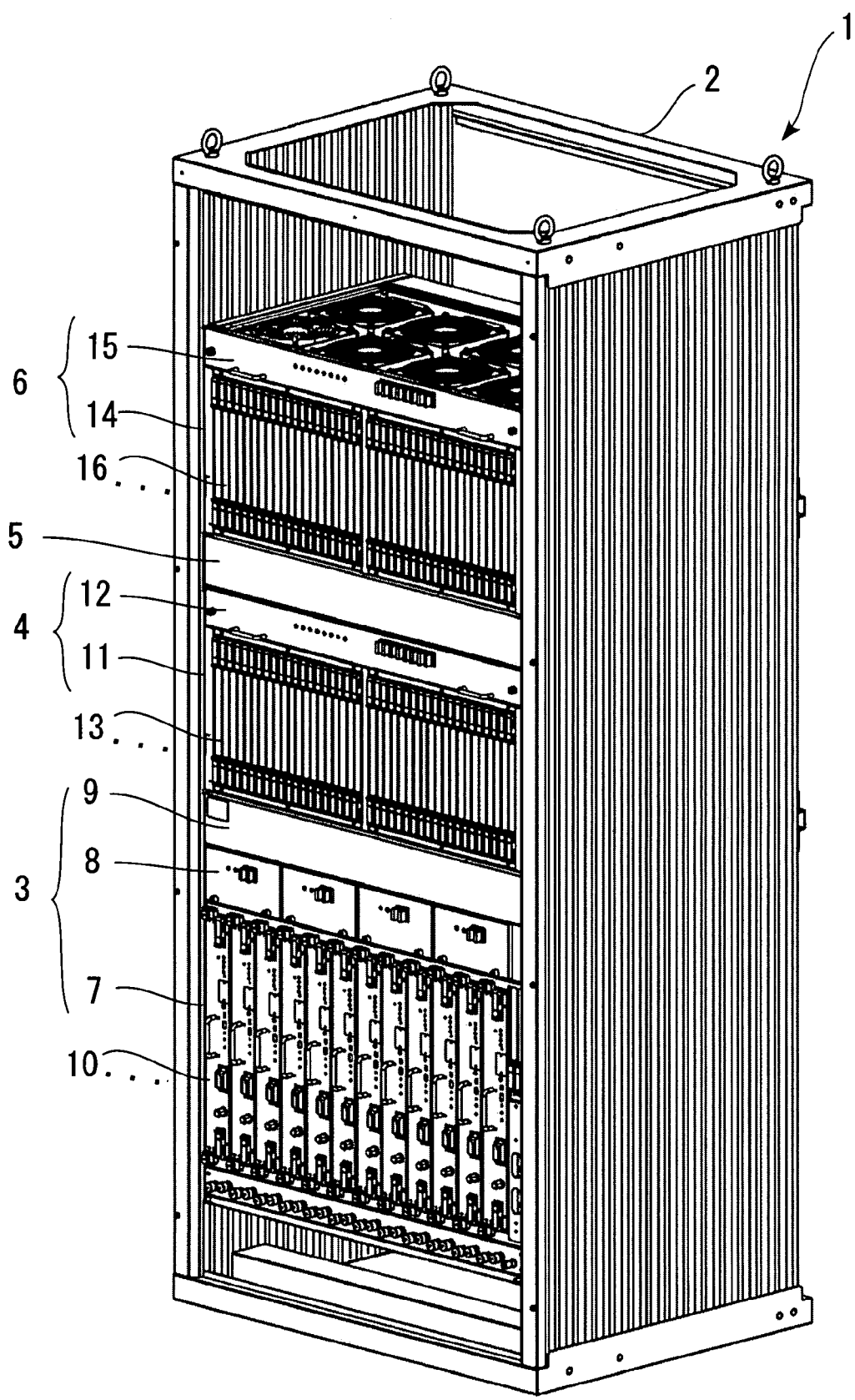
FIG. 1 is a perspective view of the construction of a communication apparatus according to a first embodiment.

The present embodiment is an application of the rack structure according to the invention to a communication apparatus. FIG. 1 is a perspective view of the construction of the communication apparatus, and FIG. 2 is an exploded perspective view of the same.

As shown in FIG. 1, the communication apparatus 1 is formed by arranging a shelf unit 3, a shelf unit 4, a heat shield plate 5, and a shelf unit 6, within a rack 2 including a frame formed by welding sheet metal components, in the mentioned order from the bottom.

Figure 2:
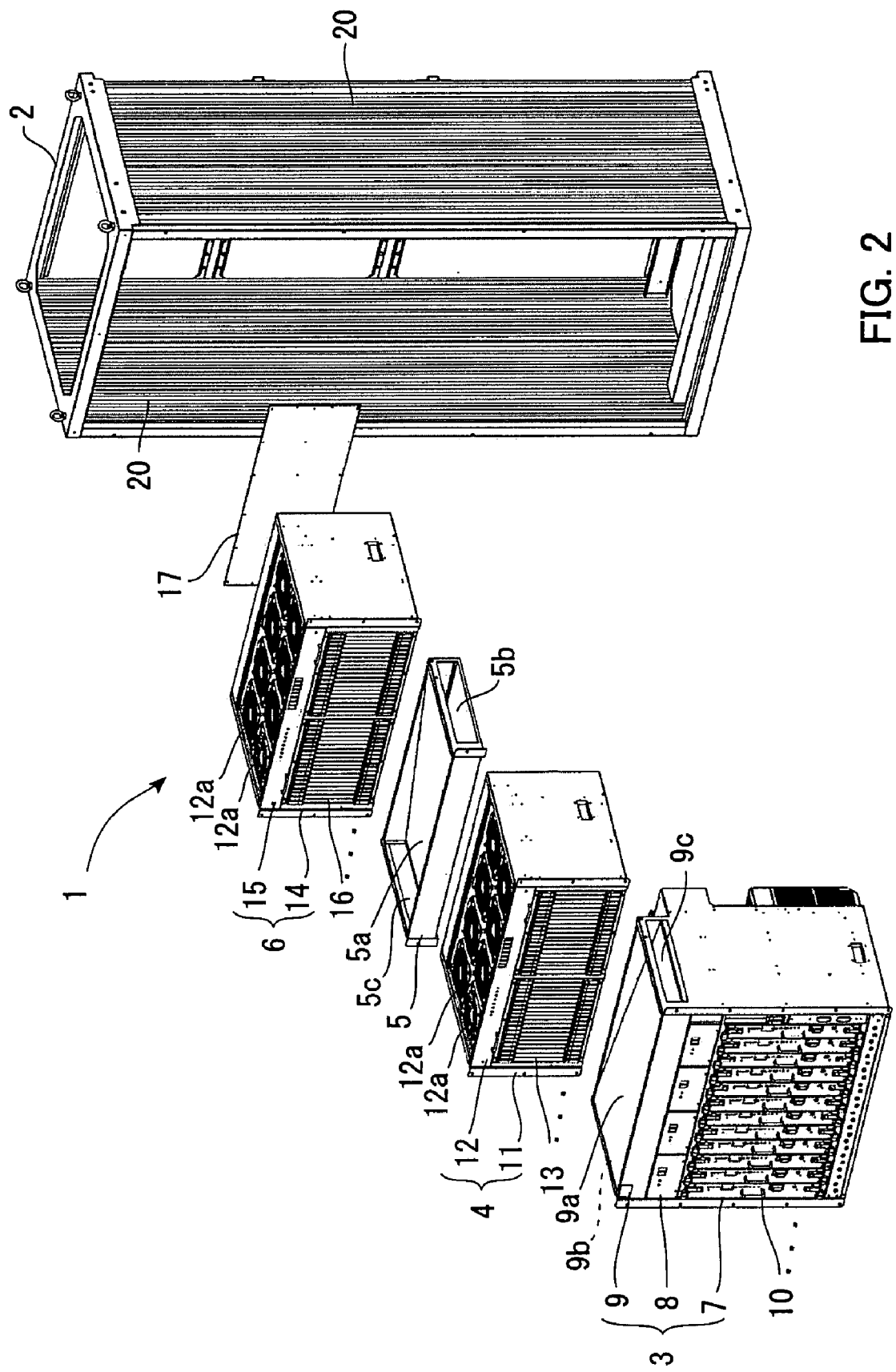
FIG. 2. is an exploded perspective view of the construction of the communication apparatus.

As shown in FIG. 2, the shelf unit 3 is formed by integrally assembling a box-shaped shelf 7 having respective openings in the top and bottom thereof, a fan unit 8 disposed in a manner opposite to the top opening of the shelf 7, and a heat shield plate 9 disposed to cover the fan unit 8. The heat shield plate 9 has a partition plate 9a vertically diagonally partitioning the inside of a box-shaped body formed to open on lateral sides. The heat shield plate 9 is disposed such that it covers the fan unit 8 immediately below from above, so as to prevent air delivered from the fan unit 8 from directly entering the inside of the shelf 11 immediately above. Further, the lower region thereof under the partition plate 9a forms a delivery passage for delivering air caused to flow therein from the shelf 7 below via the fan unit 8, via a left-side opening 9b, while the upper region thereof forms an introducing passage for guiding air introduced from a right-side opening 9c into the shelf 11 immediately above. The shelf 7 accommodates a plurality of printed circuit boards 10 having communication electronic components mounted thereon such that they are vertically disposed parallel to each other. With this arrangement, air introduced into the shelf 7 via the bottom opening thereof by driving the fan unit 8 cools the printed circuit boards 10 when passing through space between adjacent ones of the printed circuit boards 10. Then, the air increased in temperature by heat exchange occurring at this time is delivered from the top opening of the shelf 7 into the partition plate 9 via the fan unit 8.

The shelf unit 4 is formed by integrally assembling a box-shaped shelf 11 having respective openings in the top and bottom thereof, and a fan unit 12 disposed in a manner opposite to the top opening of the shelf 11. The shelf 11 accommodates a plurality of printed circuit boards 13 having communication electronic parts mounted thereon such that they are vertically disposed parallel to each other. The fan unit 12 is formed by a plurality of fans 12a in two rows in the depth direction and four rows in the lateral direction, for causing forced ventilation of air from the bottom opening of the shelf 11 immediately below to the top opening of the same. It should be noted that although not shown in FIG. 2, the above-mentioned fan unit 8 is also formed by a plurality of fans similarly to the fan unit 12.

The shelf unit 6 has the same construction as that of the shelf unit 4, and is formed by integrally assembling a box-shaped shelf 14 having respective openings in the top and bottom thereof, and a fan unit 15 disposed in a manner opposite to the top opening of the shelf 14. The shelf 14 accommodates a plurality of printed circuit boards 16 having communication electronic parts mounted thereon such that they are vertically disposed parallel to each other. The fan unit 15 is formed by a plurality of fans 12a.

The heat shield plate 5 has the same construction as that of the heat shield plate 9 integrally formed with the shelf unit 3, but are formed independently of the shelf units 4 and 6 vertically adjacent thereto. That is, the heat shield plate 5 has a partition plate 5a that vertically diagonally partitions the inside of a box-shaped body formed to open on lateral sides. The direction of slope of the partition plate 5a is opposite to that of the partition plate 9a of the heat shield plate 9. The heat shield plate 5 is disposed such that it covers the fan unit 12 immediately below from above, so as to prevent air delivered from the fan unit 12 from directly entering the inside of the shelf 14 immediately above. Further, the lower region thereof under the partition plate 5a forms a delivery passage for delivering air caused to flow therein from the shelf 11 below via the fan unit 12, via a right-side opening 5b, while the upper region thereof forms an introducing passage for guiding air introduced from a left-side opening 5c into the shelf 14 immediately above. Air introduced into the shelf 11 via the bottom opening thereof by driving the fan unit 12 cools the printed circuit boards 13 when passing through space between adjacent ones of the printed circuit boards 13. Then, the air increased in temperature by heat exchange occurring at this time is delivered from the top opening of the shelf 11 into the partition plate 5 via the fan unit 12.

The printed circuit boards are mounted on the back wiring board 17 or the like provided for each shelf, and have electrical functions.

Further, the rack 2 has a pair of heat-dissipating walls 20 on lateral opposite sides thereof which form the side walls of the communication apparatus 1, thereby closing the lateral sides thereof.

Figure 3A:
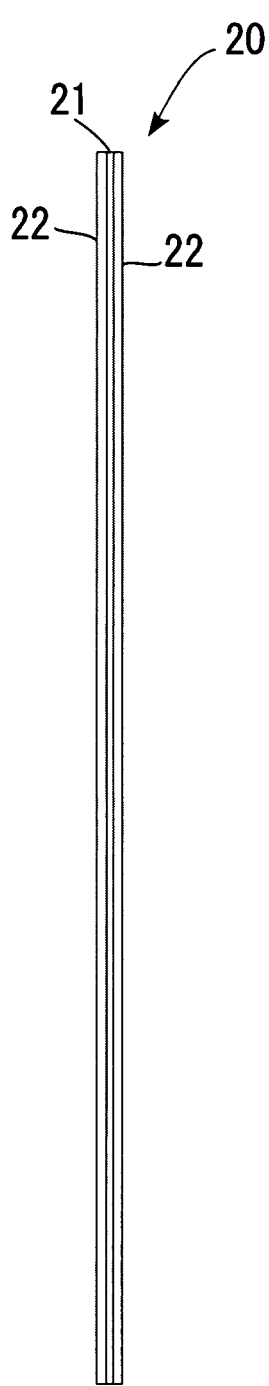
Figure 3B:
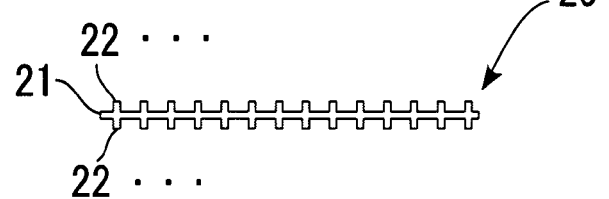
Figure 3C:
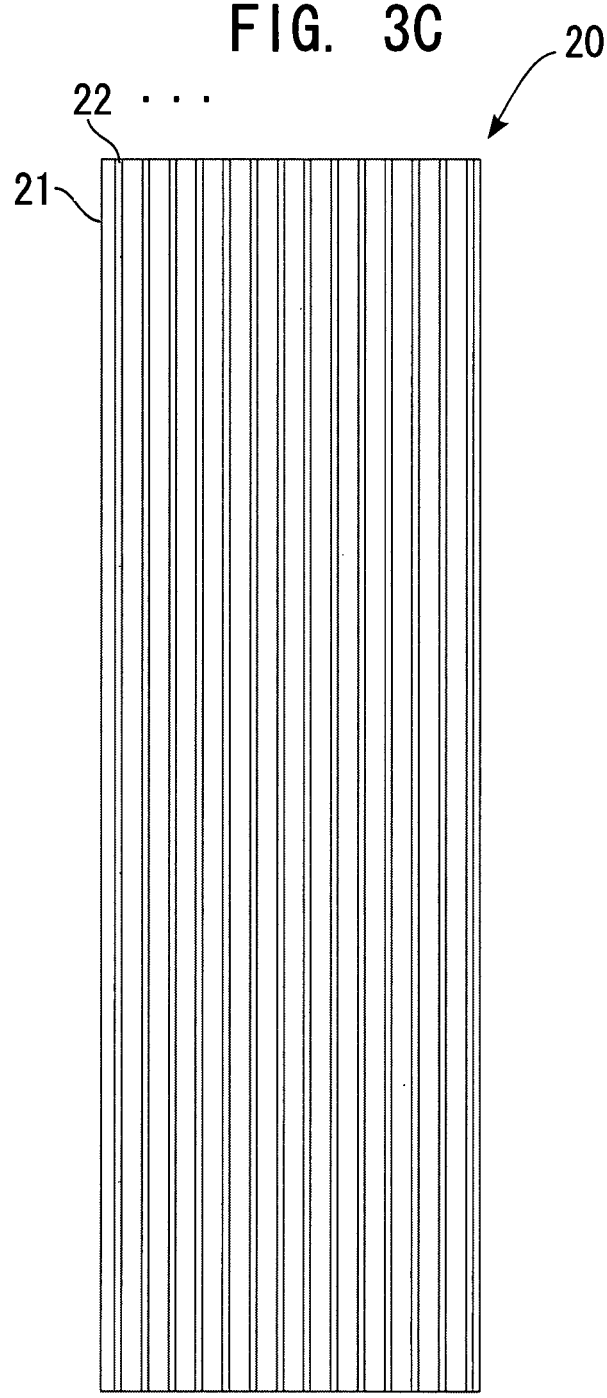

Next, a description will be given of the rack structure of the present embodiment. FIGS. 3A, 3B and 3C are explanatory views of the structure of the heat-dissipating wall forming the rack structure, and FIG. 3A is a front view thereof, FIG. 3B a plan view of the same, and FIG. 3C a side view of the same.

As shown in FIGS. 3A, 3B, and 3C, the heat-dissipating wall 20 is formed by extrusion of an aluminum material having an excellent thermal conductivity, and has a plurality of linear fins 22 extending from an upper end to a lower end, formed parallel to each other at predetermined space intervals on opposite sides of a body 21 in the form of an elongated plate. The height and thickness of the fins 22 and the spacing between them are set such that a heat conductive area can be secured which can attain sufficient heat exchange with air flowing through the inside of the communication apparatus 1, and at the same time ventilation resistance thereof can be held small.

Figure 4:
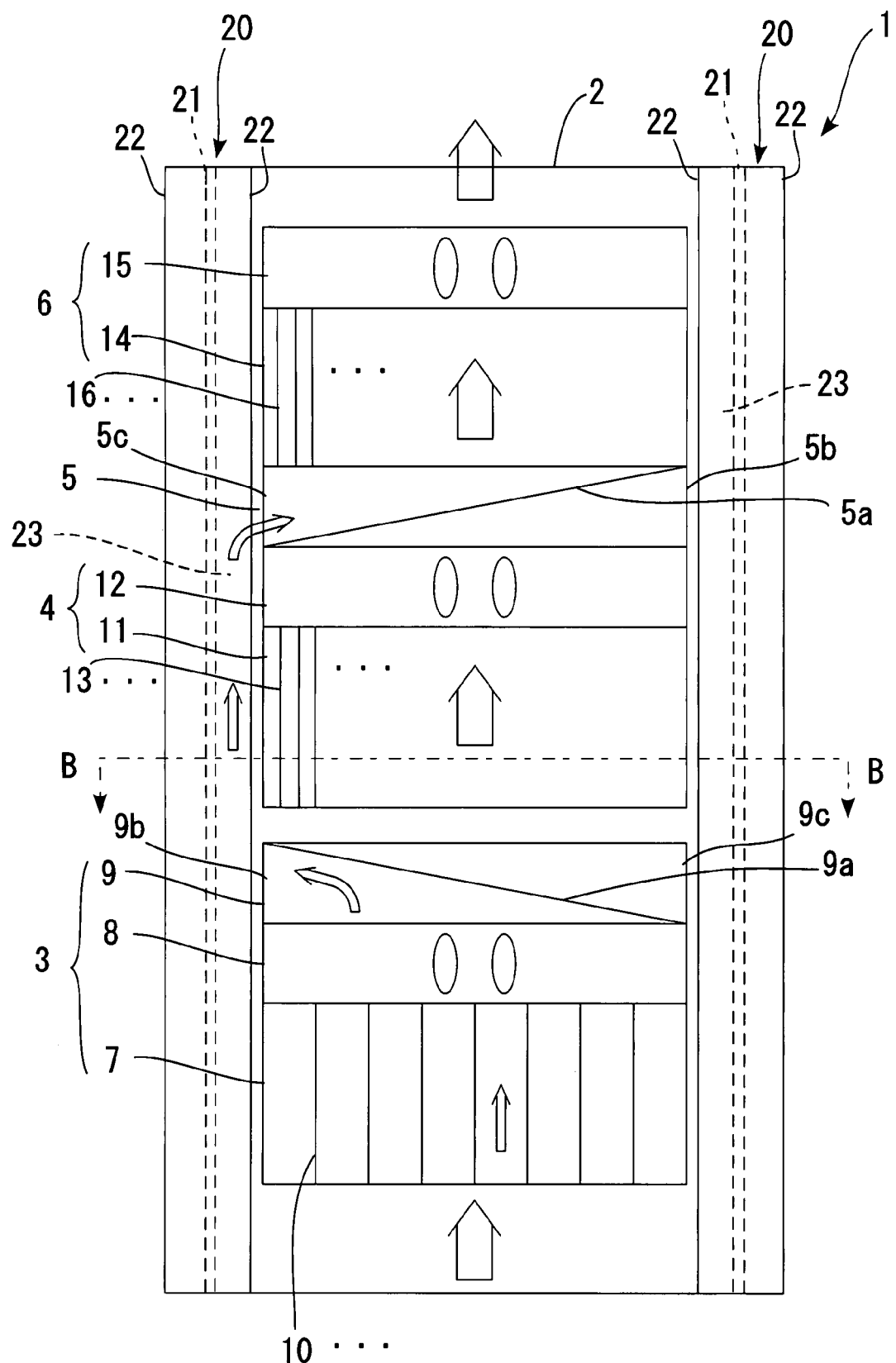
FIG. 4 is a schematic explanatory view of the inside of the communication apparatus, and flows of air produced by forced ventilation.

Next, a description will be given of a ventilation structure of the communication apparatus, and a cooling method by forced ventilation. FIG. 4 is a schematic explanatory view of the inside of the communication apparatus, and flows of air produced by forced ventilation, and FIG. 5 is a cross-sectional view taken on line B-B of FIG. 4.

Figure 5:
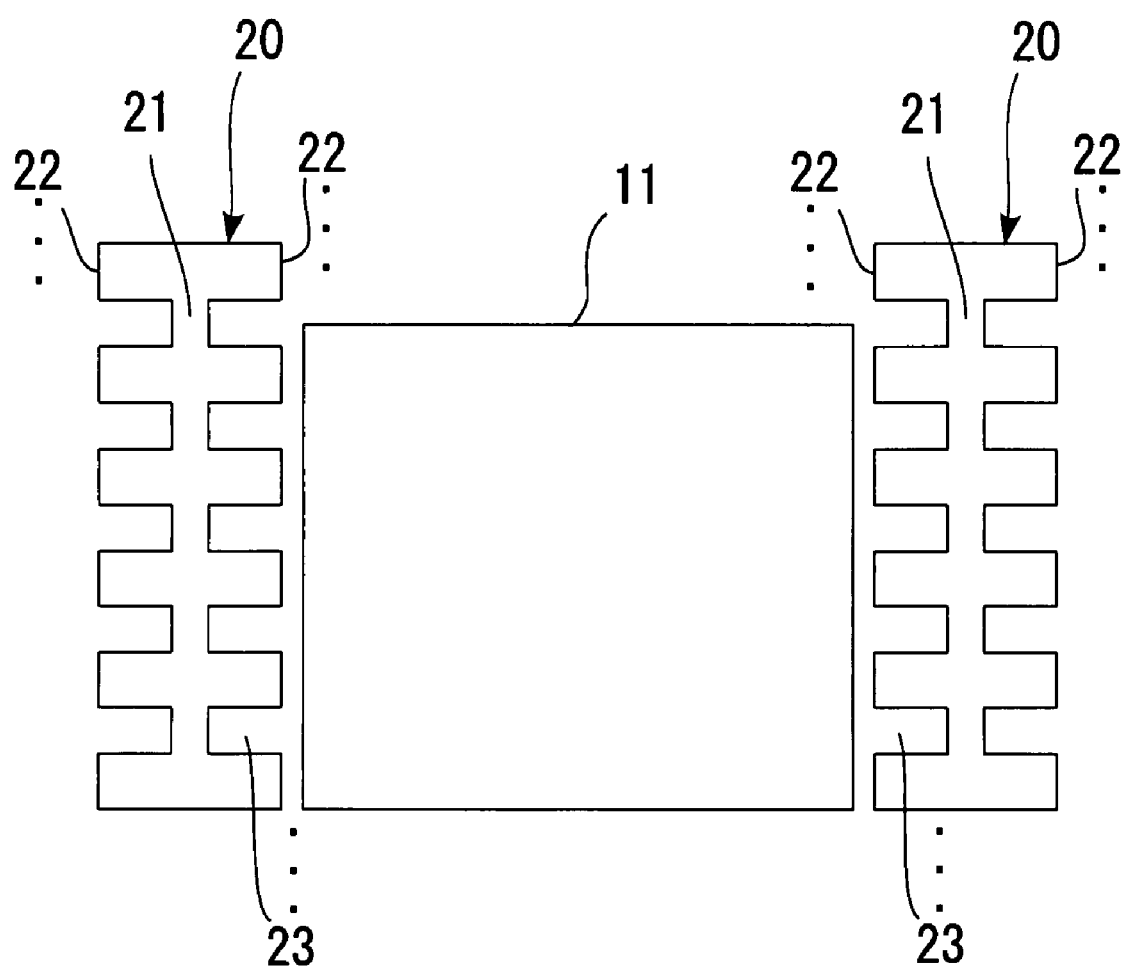
FIG. 5 is a cross-sectional view taken on line B-B of FIG. 4.

As shown in FIGS. 4 and 5, the aforementioned pair of heat-dissipating walls 20 is mounted on the lateral sides of the rack 2 to form the side walls of the communication apparatus 1. The shelf units 3, 4, and 6 and the heat shield plate 5 are arranged in a manner sandwiched between these heat-dissipating walls 20, and the right-side opening 5b and the left-side opening 5c of the heat shield plate 5 and the left-side opening 9b and the right-side opening 9c of the heat shield plate 9 are arranged such that they are opposite to the heat-dissipating walls 20. In the present embodiment, the spacing between the shelf units 3, 4, and 6 and respective ends of the inner ones of the fins 22 on the each heat-dissipating wall is set to as small as approximately 1 mm, and hence heat-dissipating ducts 23 which extend vertically are formed between grooves formed between adjacent ones of the fins 22 and the side walls of the shelf units. Warm air delivered in between the shelf units and the heat-dissipating walls is guided upward only via the heat-dissipating ducts 23.

That is, as indicated by arrows in FIG. 4, outside air drawn in from the bottom opening of the shelf 7 at the lowest stage by the driving of the fan unit 8 cools the printed circuit boards 10 when passing through space between adjacent ones thereof. Then, the air increased in temperature by heat exchange occurring at this time is delivered from the top opening of the shelf 7 into the heat shield plate 9 via the fan unit 8. The warm air is guided by the partition plate 9a of the heat shield plate 9 to be delivered out from the left-side opening 9b and is carried up through the heat-dissipating duct 23. At this time, the air is cooled by heat exchange with the fins 22. On the other hand, since the fan unit 15 at the highest stage is being driven above, the cooled air is introduced into the heat shield plate 5 disposed above via the left-side opening 5c thereof to be introduced into the shelf unit 6. The air cools the printed circuit boards 16 disposed within the shelf 14 while passing through space between adjacent ones thereof, and is discharged to the outside from the top opening of the rack 2 via the fan unit 15.

On the other hand, although not shown in FIG. 4, outside air introduced via the left-side heat-dissipating duct 23 by driving of the fan unit 12 of the shelf unit 4 is introduced into the heat shield plate 9 from the right-side opening 9c. Then, the air cools the printed circuit boards disposed within the shelf 11 when passing through space between adjacent ones of the printed circuit boards 13. Then, the air which is increased in temperature by heat exchange occurring at this time is delivered from the top opening of the shelf 11 into the lower region of the heat shield plate 5 via the fan unit 12. The warmed air is guided by the partition plate 5a of the heat shield plate 5 to be delivered from the right-side opening 5b into the heat-dissipating duct 23, and is discharged from the top opening thereof to the outside.

It should be noted although not shown in the above-described construction, to positively introduce air cooled by the left-side heat-dissipating duct 23 into the upper region of the heat shield plate 5, there may be provided a guide that partitions a portion of the heat-dissipating duct 23 close to the heat-shield plate 5 to switch the direction of flow of air and thereby guide the air into the left-side opening 5c of the heat shield plate 5. Further, a partition may be provided e.g. in the left-side heat-dissipating duct 23 at a location slightly below the heat shield plate 9, thereby blocking the flow-in of outside air from the bottom of the heat-dissipating duct 23, so as to make the warmed air in the lower heat shield plate 9 easy to be delivered into the heat-dissipating duct 23.

Similarly, to positively introduce outside air introduced from the bottom of the right-side heat-dissipating duct 23 into the upper region of the heat shield plate 9, there may be provided a guide that partitions a portion of the heat-dissipating duct 23 close to the heat shield plate 9 to switch the direction of flow of air and thereby guide the air into the right-side opening 9c of the heat shield plate 9.

Figure 6:
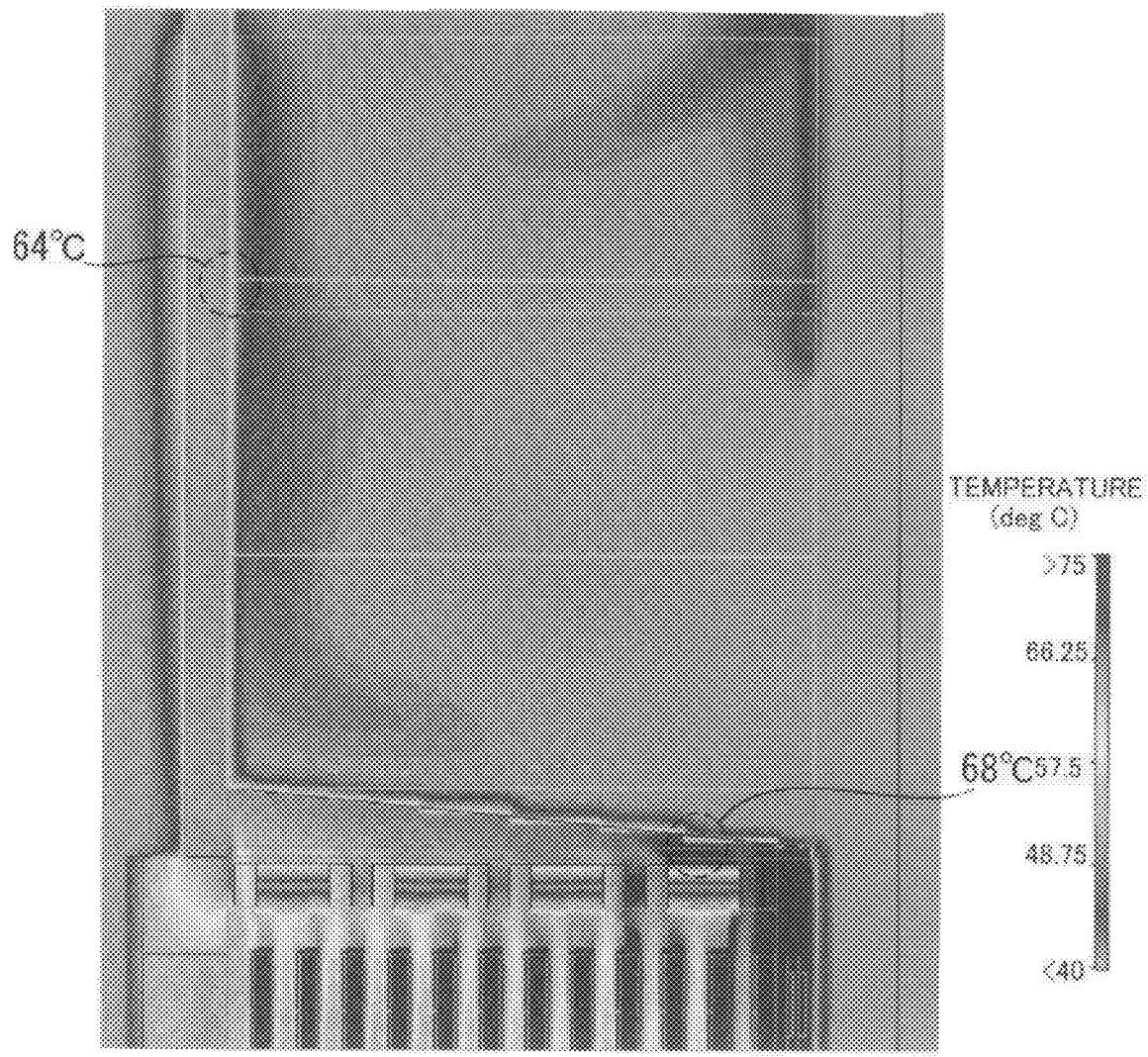
FIG. 6 is an explanatory view showing results of temperature analysis carried out for checking the cooling performance of the rack structure.

FIG. 6 is an explanatory view showing results of temperature analysis carried out for checking the cooling performance of the rack structure according to the present embodiment, and shows heat-dissipating effects obtained by provision of the heat-dissipating duct. FIG. 6 shows a temperature distribution inside the communication apparatus 1, in shades of gray, which occurs when the communication apparatus 1, with the heat-dissipating walls 20 set in the aforementioned rack 2, is started as shown in FIG. 4.

As analysis conditions, the power consumption of the apparatus is set to 4479.2 W. Further, eight fans having a size of 140×140×51 (mm) are set in each fan unit, and each fan is set to have a maximum air flow of 0.105 m$^3$/s and a maximum static pressure of 200 Pa. Further, the heat-dissipating wall 20, which has a shape as shown in FIGS. 3A, 3B, and 3C, is configured such that the body 21 has a height of 1000 mm, a width of 507.5 mm, and a thickness of 10 mm, and each fin 22 have a height of 40 mm and a thickness of 12.5 mm. The spacing between adjacent ones of the fins 22 is set to 27.5 mm.

The analysis described above shows that while the temperature of the high-temperature portion of the lower heat shield plate 9 is approximately 68 degrees, the temperature of a portion of the upper heat shield plate 5 close to the left-side opening thereof is approximately 64 degrees. That is, it has been found that the temperature of air can be lowered by approximately four degrees owing to the heat-dissipating actions of the heat-dissipating duct 23, and this contributes to the action of cooling the inside of the shelf 11 above.

As described heretofore, in the rack structure of the communication apparatus 1, the heat-dissipating walls 20 also serving as the side walls of the apparatus are provided on opposite lateral sides to form the heat-dissipating ducts 23, and the air used for cooling the printed circuit boards 10 within the lower shelf 7 and thereby increased in temperature is cooled by causing the same to flow through the heat-dissipating duct 23 and is then used again for cooling the printed circuit boards 16 within the upper shelf 14. This makes it possible to increase the heat-dissipating efficiency of the communication apparatus 1 to thereby improve the cooling performance thereof. Further, the fans of the fan unit 8 and the fans 12a of the fan unit 15 are in a push-pull state with the heat-dissipating ducts 23 therebetween, whereby the fan efficiency can be enhanced.

As a consequence, the necessity of increasing the number of cooling fans or increasing the size of fans becomes small, and the cooling performance of the communication apparatus 1 can be maintained within a limited installation space.

Further, the necessity of increasing the rotational speed of fans and the like becomes small, and noise generated by the fans is damped when passing through the heat-dissipating ducts 23, and then emitted to the outside from the top of the apparatus. This makes it possible to avoid or suppress the problem of noise and the like.

Second Embodiment

Figure 7:
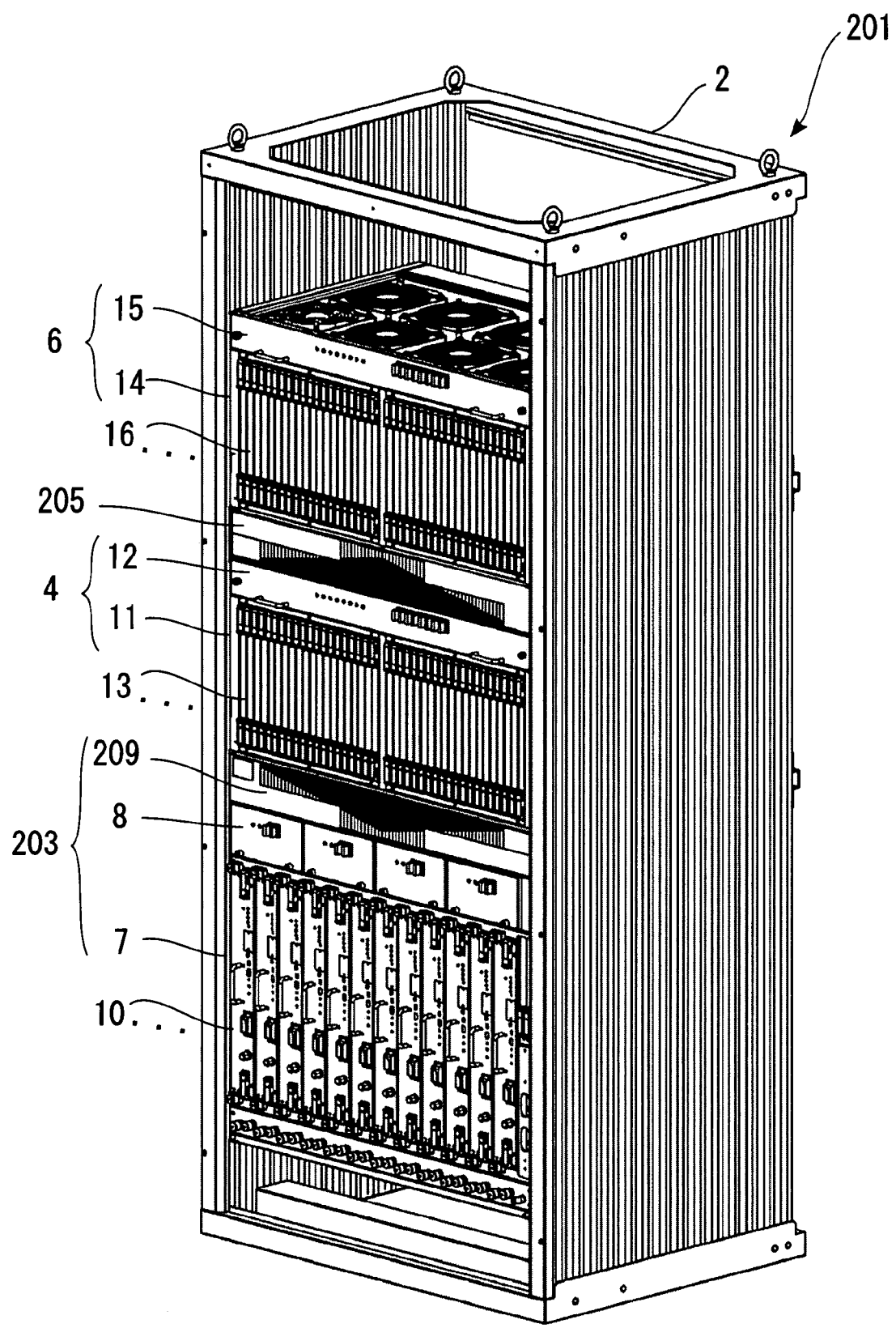
FIG. 7 is a perspective view of the construction of a communication apparatus according to a second embodiment.

Next, a description will be given of a second embodiment of the present invention. It should be noted that the present embodiment has the same construction as that of the first embodiment except that the structure of the heat shield plate is different. Therefore, component elements identical to those in the first embodiment are designated by identical reference numerals, and description thereof is omitted. FIG. 7 is a perspective view of the construction of the communication apparatus, and FIG. 8 is an exploded perspective view of the same.

As shown in FIG. 7, in the communication apparatus 201, the structure of the heat shield plate 209 of the shelf unit 203 disposed at the lowest stage and the structure of the heat shield plate 205 disposed between the shelf units 4 and 6 are different from those of the heat shield plates 9 and 5 of the first embodiment.

Figure 8:
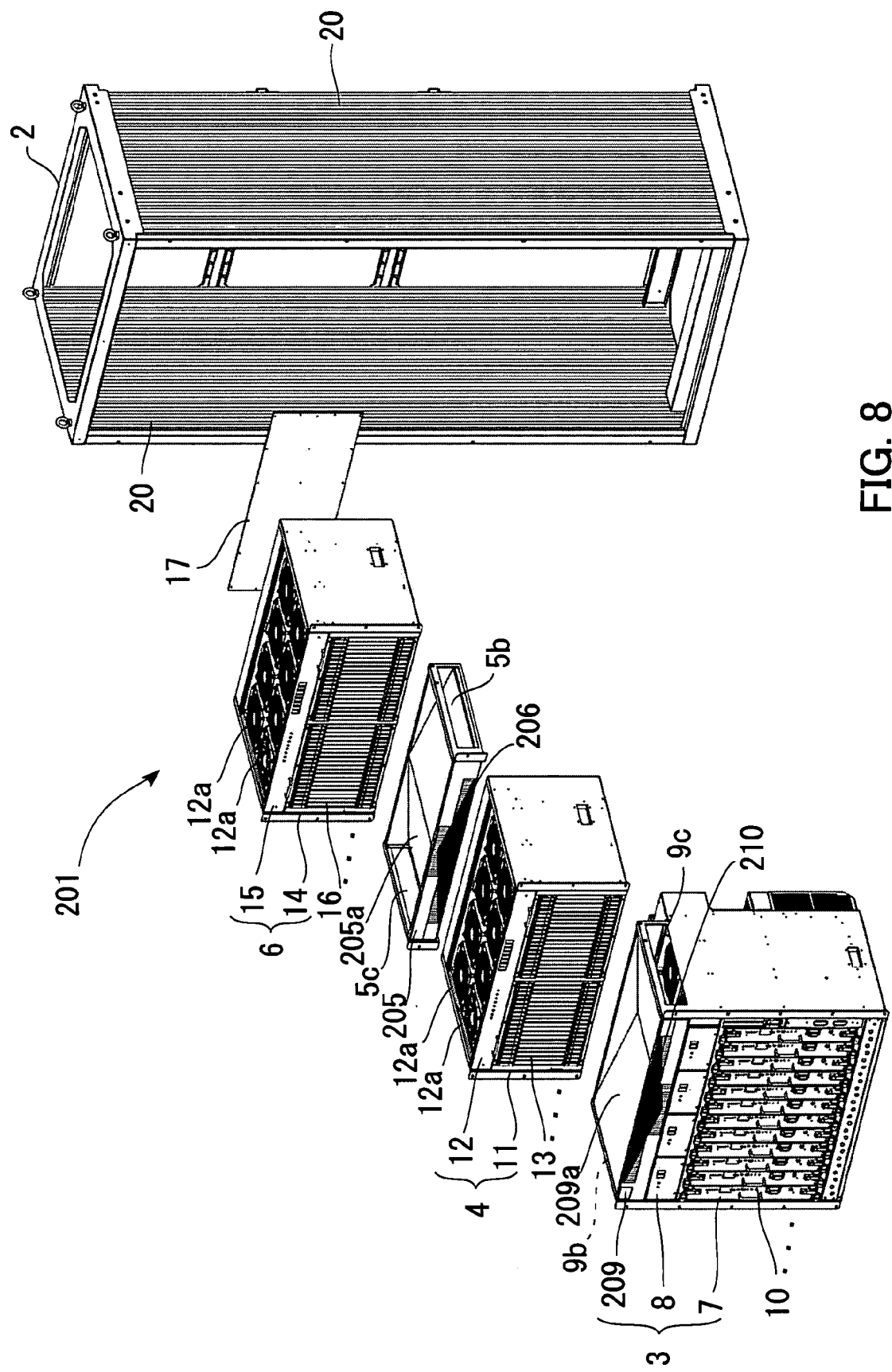
FIG. 8 is an exploded perspective view of the construction of the communication apparatus.

As shown in FIG. 8, the heat shield plate 209 has a V-shaped partition plate 209a for splitting air into lateral branches within its body. That is, a region below the partition plate 209a is formed into delivery passages for splitting the air delivered from the shelf 7 below via the fan unit 8 into lateral branches, to thereby deliver the air from the left-side opening 9b and the right-side opening 9c. Further, a region above the partition plate 209a is formed into an introducing passage for introducing outside air from a front opening 210 opening in the front face of the communication apparatus 201, and causing the air to enter the shelf 11 immediately above.

On the other hand, the heat shield plate 205 has an inverted V-shaped partition plate 205a for drawing in air from lateral sides. A region above the heat shield plate 205 is formed into an introducing passage for introducing air cooled when flowing through the heat-dissipating ducts, from the right-side opening 5b and the left-side opening 5c, and causing the same to enter the shelf 14 immediately above. Further, a region below the heat shield plate 205 discharges the air delivered from the fan unit 12 immediately below from a front opening 206 which opens in the front of the communication apparatus 201.

Figure 9:
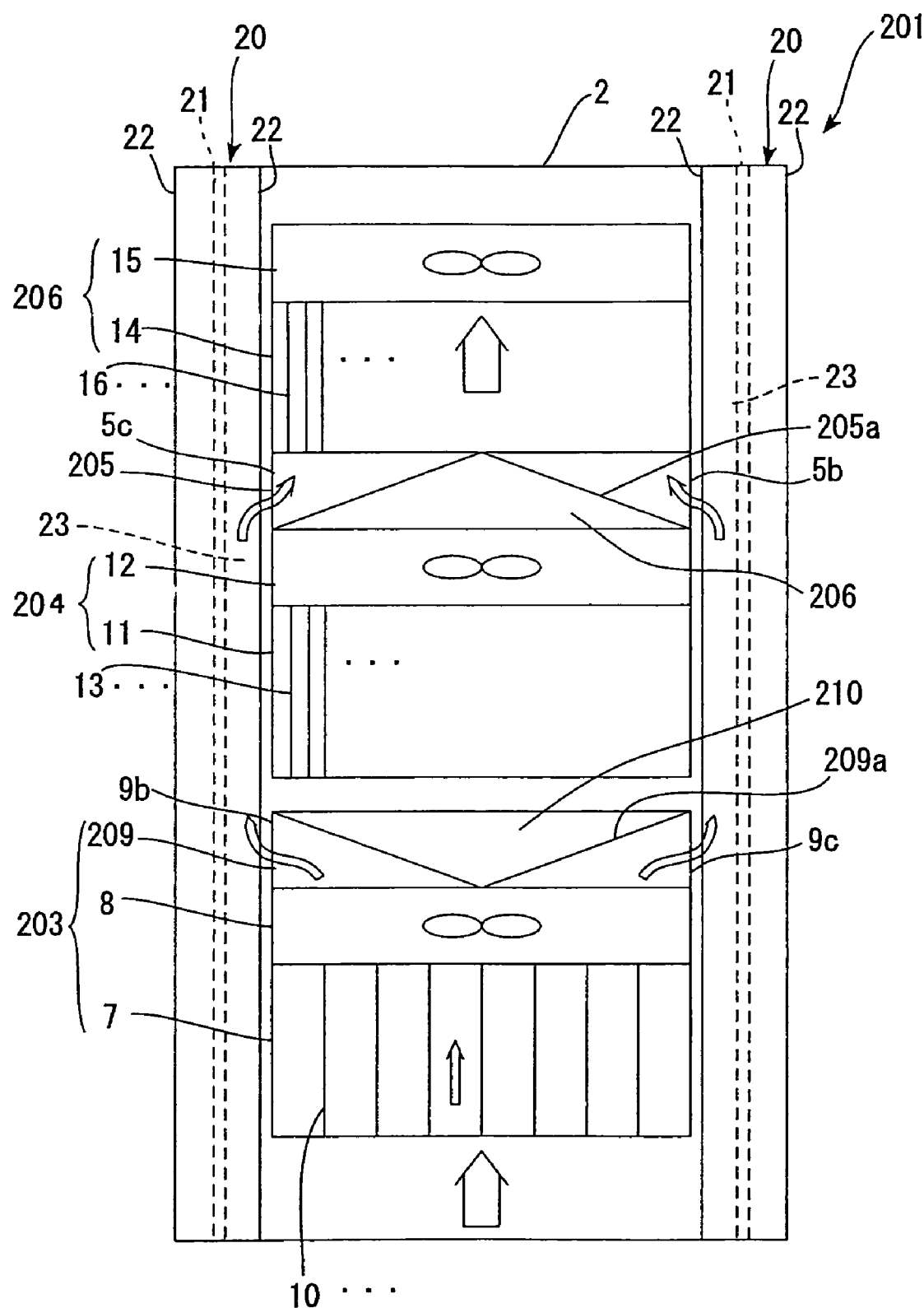
FIG. 9 is a schematic explanatory view of the inside of the communication apparatus, and flows of air produced by forced ventilation.

Next, a description will be given of a ventilation structure of the communication apparatus and a method of cooling by forced ventilation. FIG. 9 is a schematic explanatory view of the inside of the communication apparatus, and flows of air produced by forced ventilation.

The rack 2 of the communication apparatus 201 has the aforementioned pair of heat-dissipating walls 20 mounted on the lateral sides thereof, and the shelf units 203, 204, and 206 and the heat shield plate 205 are disposed in a manner sandwiched between these heat-dissipating walls 20.

Then, as indicated by arrows, outside air introduced from the bottom opening of the shelf 7 at the lowest stage by driving of the fan unit 8 cools the printed circuit boards 10 when passing through space between adjacent ones thereof. Then, the air increased in temperature by heat exchange occurring at this time is delivered from the top opening of the shelf 7 into the heat shield plate 209 via the fan unit 8. The warm air is laterally split by the partition plate 209a of the heat shield plate 209 into lateral branches, and guided by the partition plate 209a to be delivered from the left-side opening 9b and the right-side opening 9c. Then, the air is carried upward through the left and right heat-dissipating ducts 23. At this time, the air is cooled by heat exchange with the fins 22.

On the other hand, since the fan unit 15 at the highest stage is being driven above, the thus cooled air is introduced into the heat shield plate 205 disposed above via the left-side opening 5c and the right-side opening 5b thereof to be introduced into the shelf unit 6. The air cools the printed circuit boards 16 disposed within the shelf 14 while passing through space between adjacent ones thereof, and is discharged to the outside from the top opening of the rack 2 via the fan unit 15.

On the other hand, although not shown in FIG. 9, outside air introduced from the front opening 210 of the heat shield plate 209 is introduced into the shelf 11 immediately above, by driving of the fan unit 12 of the shelf unit 4. Then, the air cools the printed circuit boards 13 disposed within the shelf 11 when passing through space between adjacent ones thereof. Then, the air increased in temperature by heat exchange occurring at this time is delivered into the lower region of the heat shield plate 205 via the fan unit 12. The warm air is discharged from the front opening 206 of the heat shield plate 205 to the outside.

It should be noted although not shown in the above-described construction, to positively introduce air cooled by the left and right side heat-dissipating ducts 23 into the upper region of the heat shield plate 205, there may be provided a guide that partitions a portion of each heat-dissipating duct 23 close to the heat shield plate 205 to switch the direction of flow of air and thereby guide the air into the right-side opening 5b and the left-side opening 5c of the heat shield plate 205. Further, to make the warmed air in the heat shield plate 209 below easy to be delivered into the heat-dissipating ducts 23, partitions may be provided in the left and right heat-dissipating ducts 23 at respective locations slightly below the heat shield plate 209, whereby outside air may be blocked from being introduced from the bottoms of the heat-dissipating ducts 23.

Figure 10:
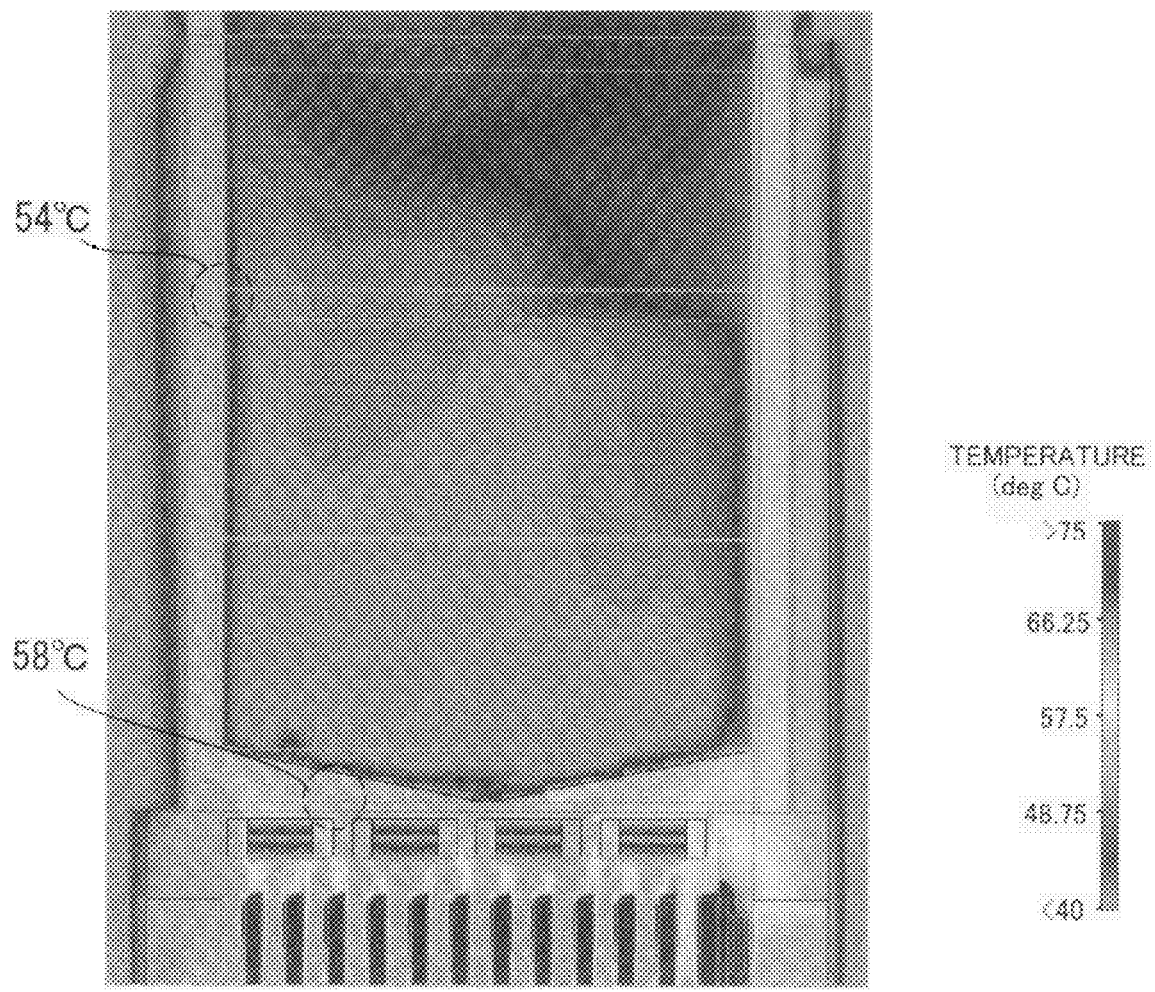
FIG. 10 is an explanatory view showing results of temperature analysis carried out for checking the cooling performance of the rack structure.

FIG. 10 is an explanatory view showing results of temperature analysis carried out for checking the cooling performance of the rack structure according to the present embodiment, and shows heat-dissipating effects obtained by provision of the heat-dissipating duct. FIG. 10 also shows a temperature distribution inside the communication apparatus 201, in shades of gray, which occurs when the communication apparatus 201, with the heat-dissipating walls 20 set in the aforementioned rack 2, is started as shown in FIG. 9.

It should be noted that the analysis conditions are same as those of the first embodiment, and hence description thereof is omitted.

The analysis described above shows that while the temperature in the lower heat shield plate 209 is approximately 58 degrees, the temperature of a portion of the upper heat shield plate 5 close to the left-side opening thereof is approximately 54 degrees. That is, it has been found that the temperature of air can be lowered by approximately four degrees owing to the heat-dissipating actions of the heat-dissipating ducts 23, and this contributes to the action of cooling the inside of the shelf 11 above. Further, it has been found that the temperature of the entire air can be made lower than in the first embodiment by splitting the ventilation passage using the heat shield plate 209 to provide the heat-dissipating sections on the left and right sides.

As described heretofore, also in the rack structure of the communication apparatus 201, the air used for cooling the printed circuit boards 10 within the lower shelf 7 and thereby increased in temperature is cooled by causing the same to flow through the lateral heat-dissipating ducts 23, and is then used again for cooling the printed circuit boards 13 within the upper shelf 11.

This makes it possible to maintain the cooling performance of the communication apparatus 201 within a limited installation space, and avoid the problems of noise and the like. Further, since the warm air introduced into the heat shield plate 209 is split into left and right branches and simultaneously cooled by the left and right heat-dissipating ducts 23, the heat-dissipating efficiency within the communication apparatus 201 is increased, and the heat-dissipating action can be made uniform.

Third Embodiment

Figure 11:
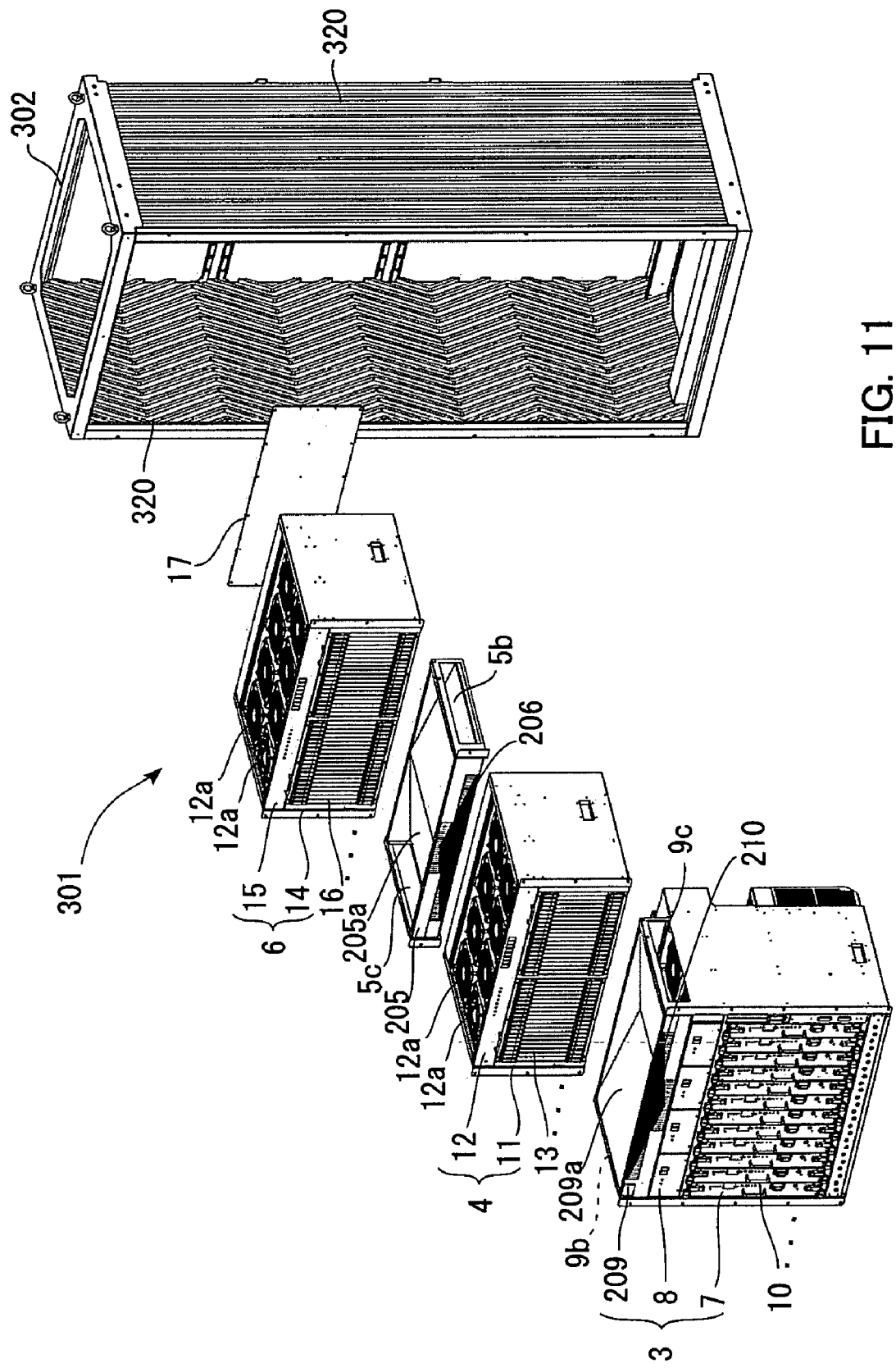
FIG. 11 is a perspective view of the construction of a communication apparatus according to a third embodiment.

Next, a description will be given of a third embodiment of the present invention. It should be noted that the present embodiment has the same construction as that of the second embodiment except that the structure of the heat-dissipating wall is different, and hence component elements identical to those in the second embodiment are designated by identical reference numerals, and description thereof is omitted. FIG. 11 is an exploded perspective view of the construction of the communication apparatus, and FIGS. 12A, 12B, and 12C are explanatory views of the structure of a heat-dissipating wall as a component of a rack structure of the communication apparatus, wherein FIG. 12A is an external side view thereof, FIG. 12B a front view of the same, and FIG. 12C an internal side view of the same.

As shown in FIG. 11, a rack 302 has a pair of heat-dissipating walls 320 on lateral opposite sides thereof which form the side walls of the communication apparatus 301, thereby closing the lateral sides thereof.

As shown in FIGS. 12A, 12B, and 12C, the heat-dissipating wall 320 is formed by aluminum die-casting, and has a plurality of linear fins 322 extending from an upper end to a lower end, formed parallel to each other at predetermined space intervals on an external side (side exposed to the outside of the communication apparatus 301) of a body 321 in the form of an elongated plate. The height and thickness of the fins 322 and the spacing between them are set such that a heat conductive area can be secured which can attain sufficient heat exchange with air flowing through the inside of the communication apparatus 301.

On the other hand, a plurality of wave-like fins 323 extending from an upper end to a lower end are formed parallel to each other at predetermined space intervals on an inner side (side exposed to the inside of the communication apparatus 301) of the body 321. The height and thickness of the fins 323 and the spacing between them are set similarly to those of the fins 322. However, since they are configured to have a wave-like shape, the length of the flow passage of the heat-dissipating ducts formed by the fins 322 is increased to increase the heat-dissipating area. Although in the figure, the fins 323 are configured to have a shape of triangular waves, this is not limitative, but they can be configured to have a shape of sine waves or other waves.

Although the rack structure of the communication apparatus 301 as well can provide the same advantageous effects with its construction similar to that of the second embodiment, the heat-dissipating area is increased owing to the wave-like configuration of the fins 323, which makes it possible to enhance the heat-dissipating effects. Further, air flowing through the heat-dissipating duct is reflected at the wave-like portions to dump noise thereof, and hence it is possible to make the noise caused by forced ventilation even lower.

Fourth Embodiment

Figure 13:
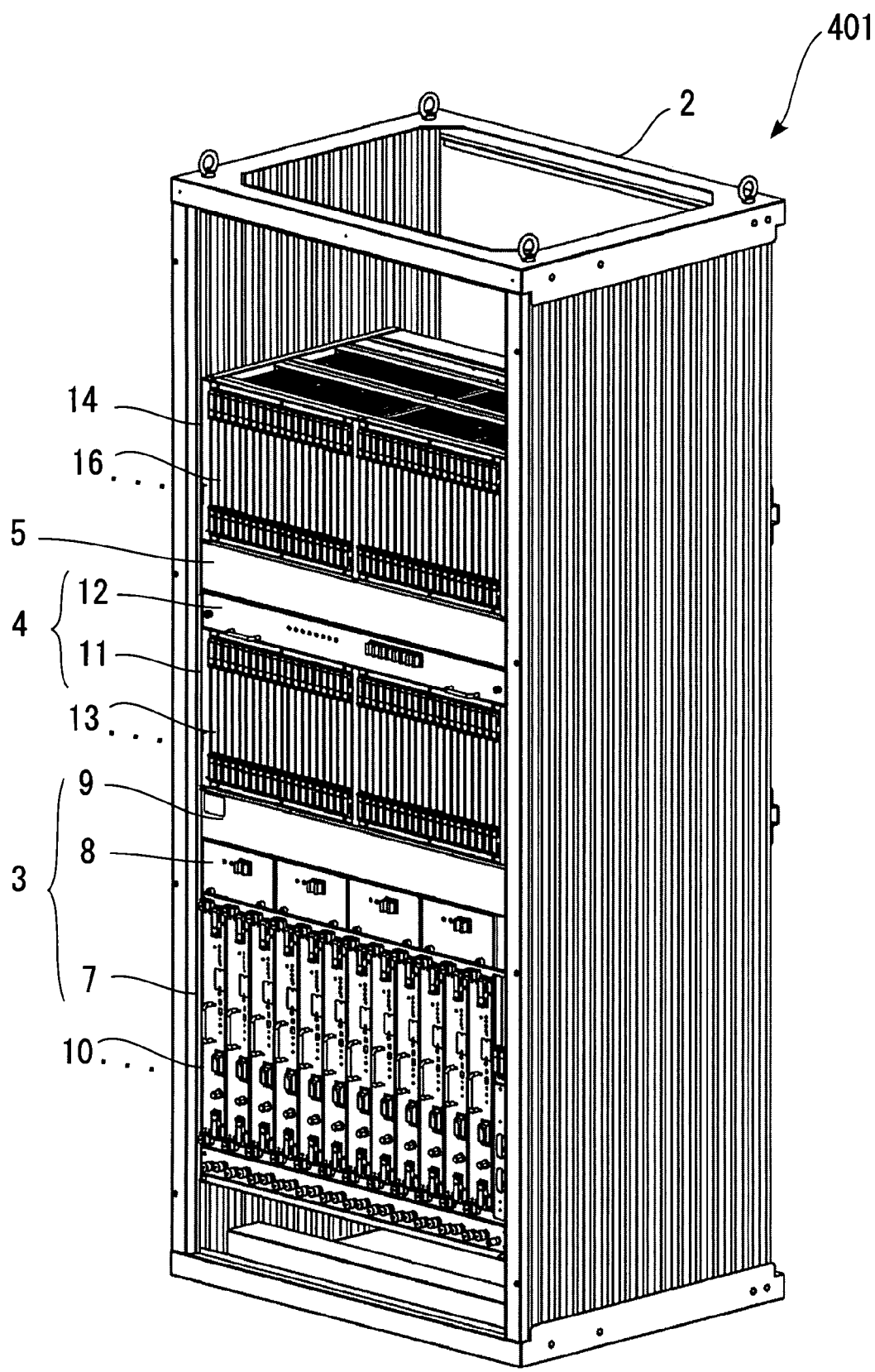
FIG. 13 is a perspective view of the construction of a communication apparatus according to a fourth embodiment.

Next, a description will be given of a fourth embodiment of the present invention. It should be noted that the present embodiment has almost the same construction as that of the first embodiment except that no fan is provided in the uppermost shelf unit. Therefore, component elements identical to those in the first embodiment are designated by identical reference numerals, and description thereof is omitted. FIG. 13 is a perspective view of the construction of a communication apparatus, and FIG. 14 is an exploded perspective view of the same.

Figure 14:
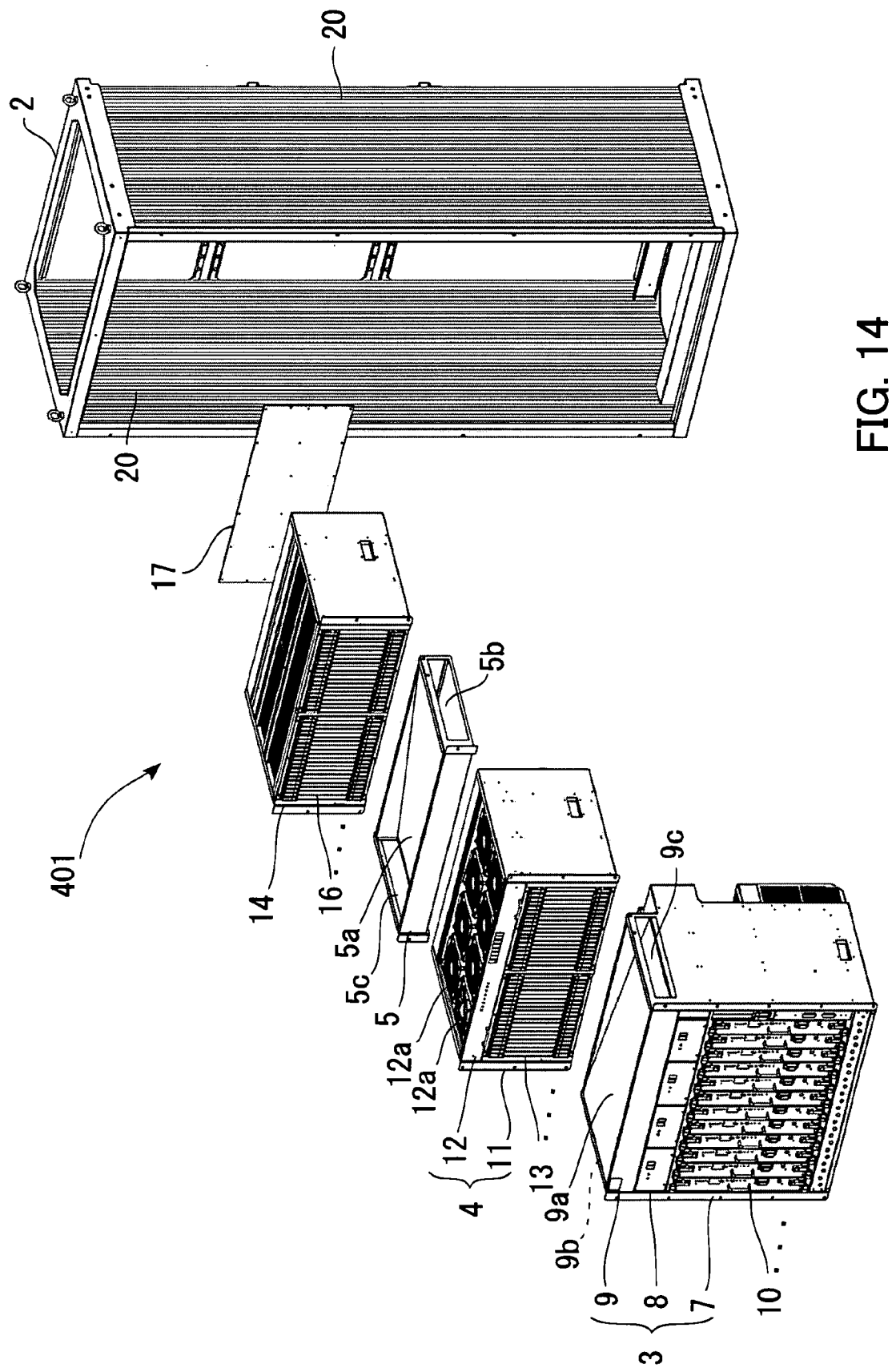
FIG. 14 is an exploded perspective view of the construction of the communication apparatus.

As shown in FIGS. 13 and 14, the communication apparatus 401 according to the present embodiment has no fan provided in the top of the uppermost shelf 14 disposed immediately above the heat shield plate 5. A plurality of printed circuit boards 16 arranged parallel to each other within the shelf 14 are naturally cooled by air introduced from the left-side heat-dissipating duct. This configuration is provided by paying attention to the fact that when the air passes through the heat-dissipating ducts which are narrow, it gains momentum due to increased flow velocity thereof, and hence a certain degree of ventilation effects can be expected even without the fan at the top.

Since the natural cooling is thus employed, to positively introduce air cooled by the left-side heat-dissipating duct into the upper region of the heat shield plate 5, it is preferable to provide a guide that partitions a portion of the heat-dissipating duct close to the heat shield plate 5 to switch the direction of flow of air and thereby guide the air into the left-side opening 5c of the heat shield plate 5.

In the rack structure of the communication apparatus 401, compared with the first embodiment, since the fan at the highest stage is omitted, the height of the entire apparatus can be made compact accordingly or the resulting available space can be used for other component elements. Further, since the number of fans is reduced, it is possible to reduce noise produced by forced ventilation accordingly.

Fifth Embodiment

Figure 15:
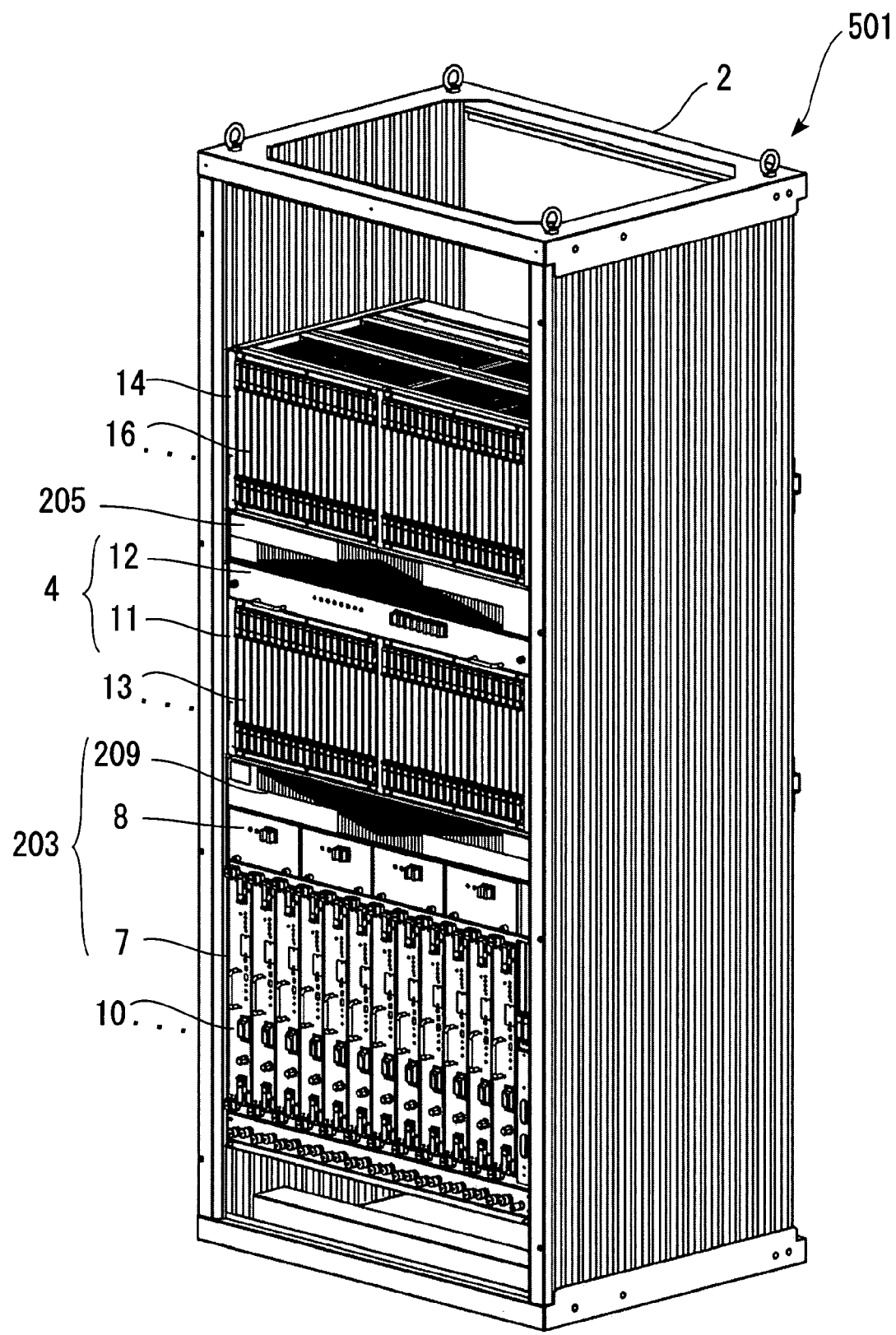
FIG. 15 is a perspective view of the construction of a communication apparatus according to a fifth embodiment.

Next, a description will be given of a fifth embodiment of the present invention. It should be noted that the present embodiment has almost the same construction as that of the second embodiment except that no fan is provided in the uppermost shelf unit, and hence component elements identical to those in the second embodiment are designated by identical reference numerals, and description thereof is omitted. FIG. 15 is a perspective view of the construction of the communication apparatus, and FIG. 16 is an exploded perspective view of the same.

Figure 16:
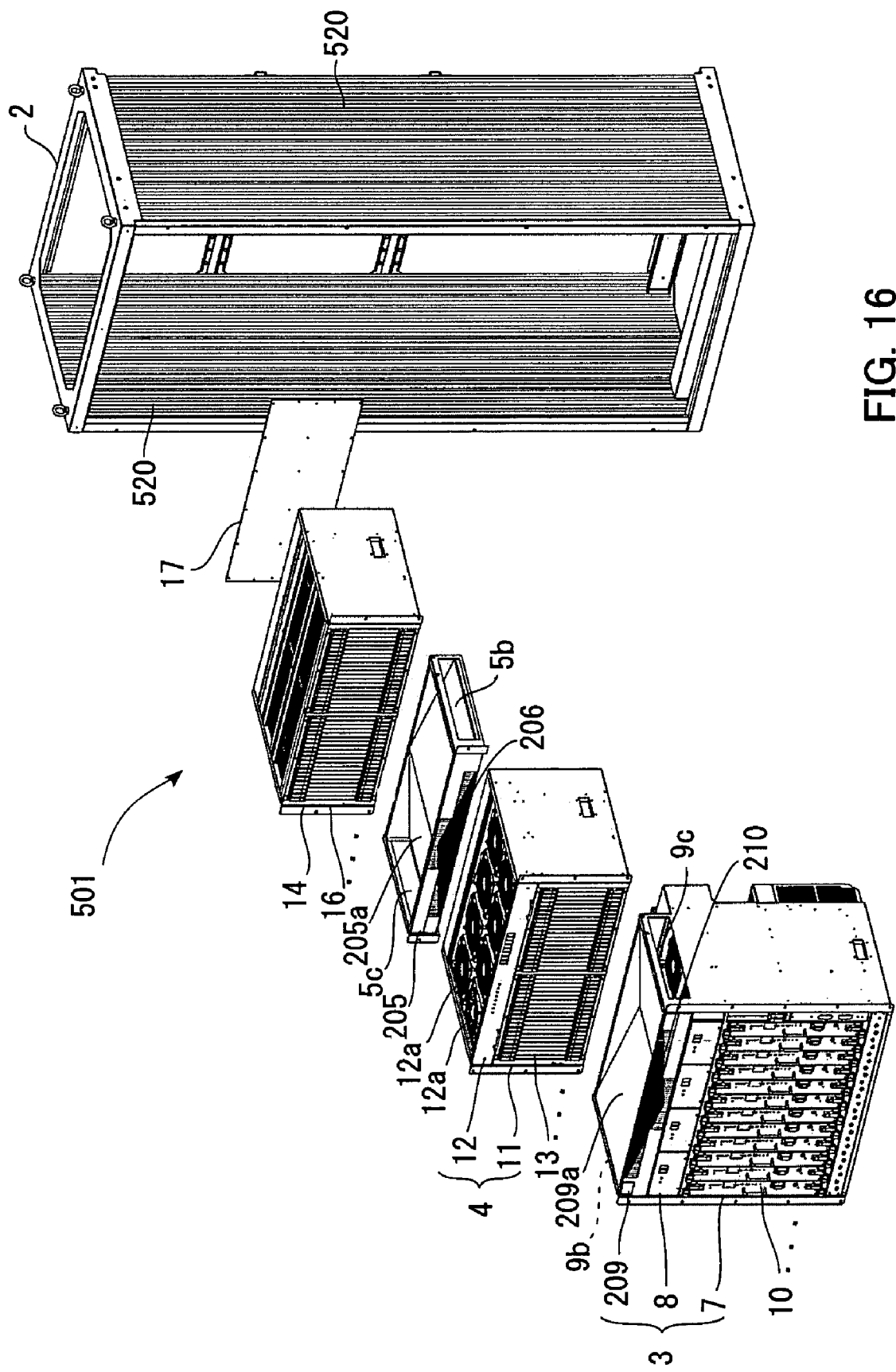
FIG. 16 is an exploded perspective view of the construction of the communication apparatus.
Figure 17:
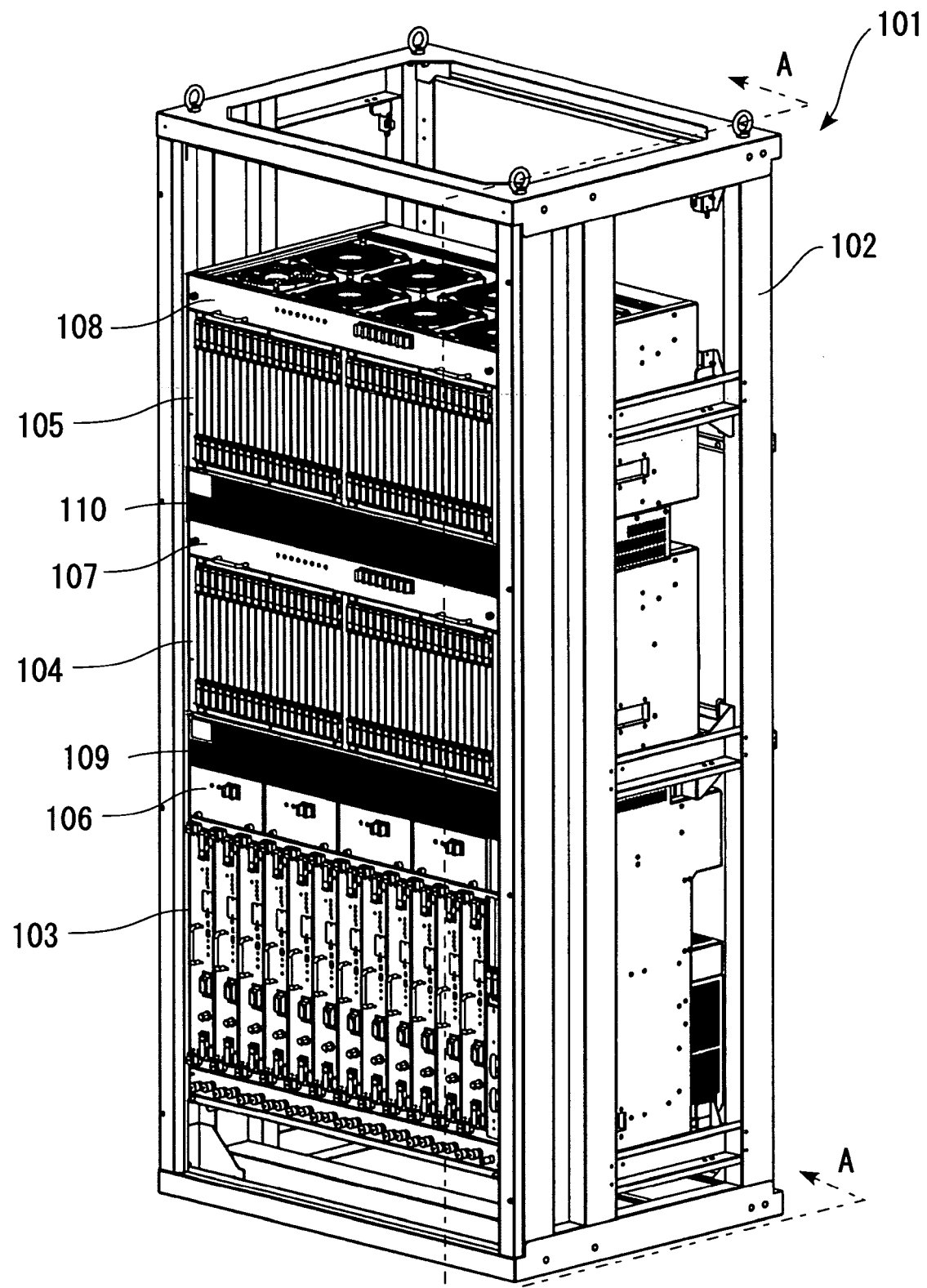
FIG. 17 is a perspective view of an example of the construction of a conventional communication apparatus.
Figure 18:
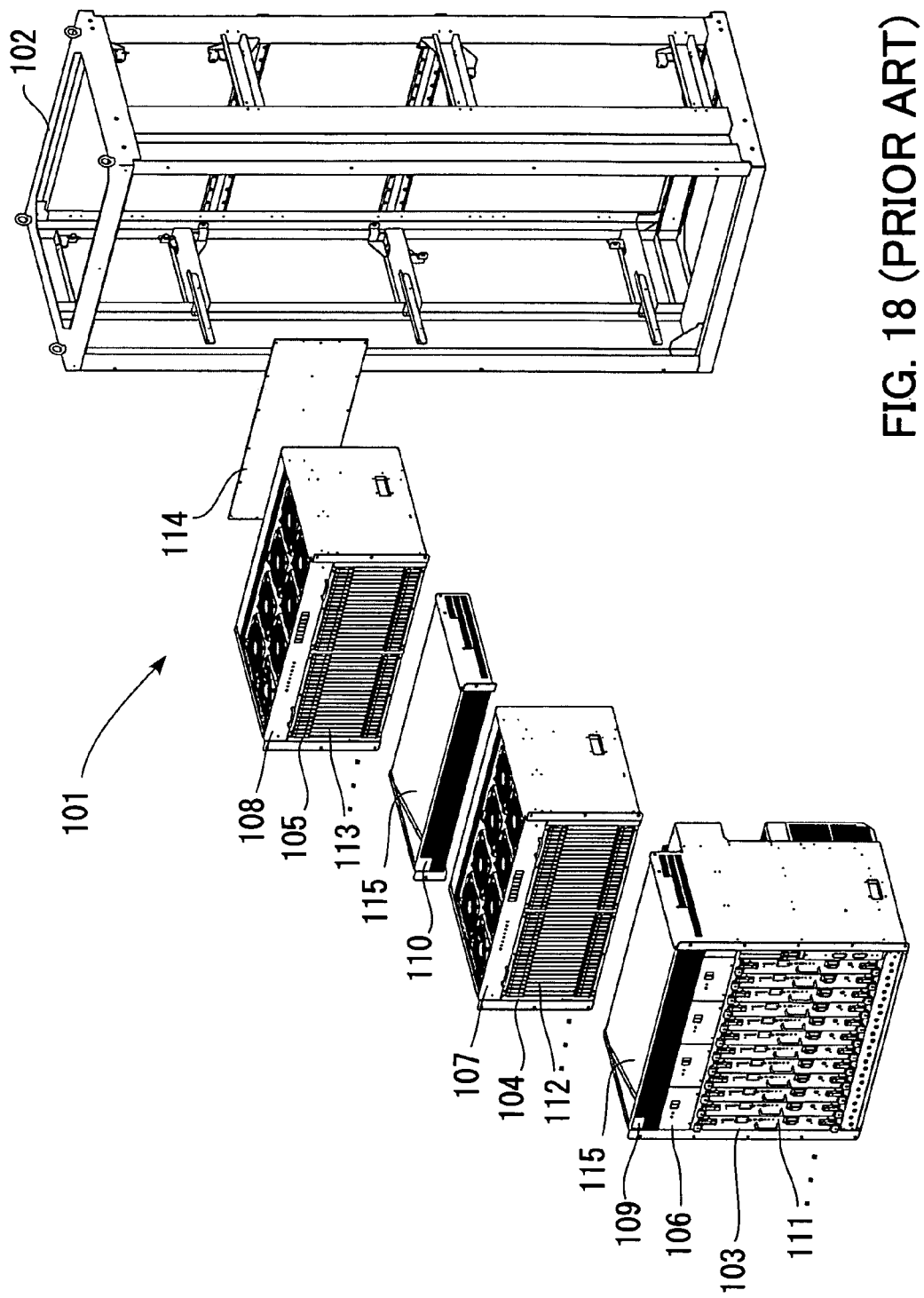
FIG. 18 is an exploded perspective of the conventional communication apparatus.
Figure 19:
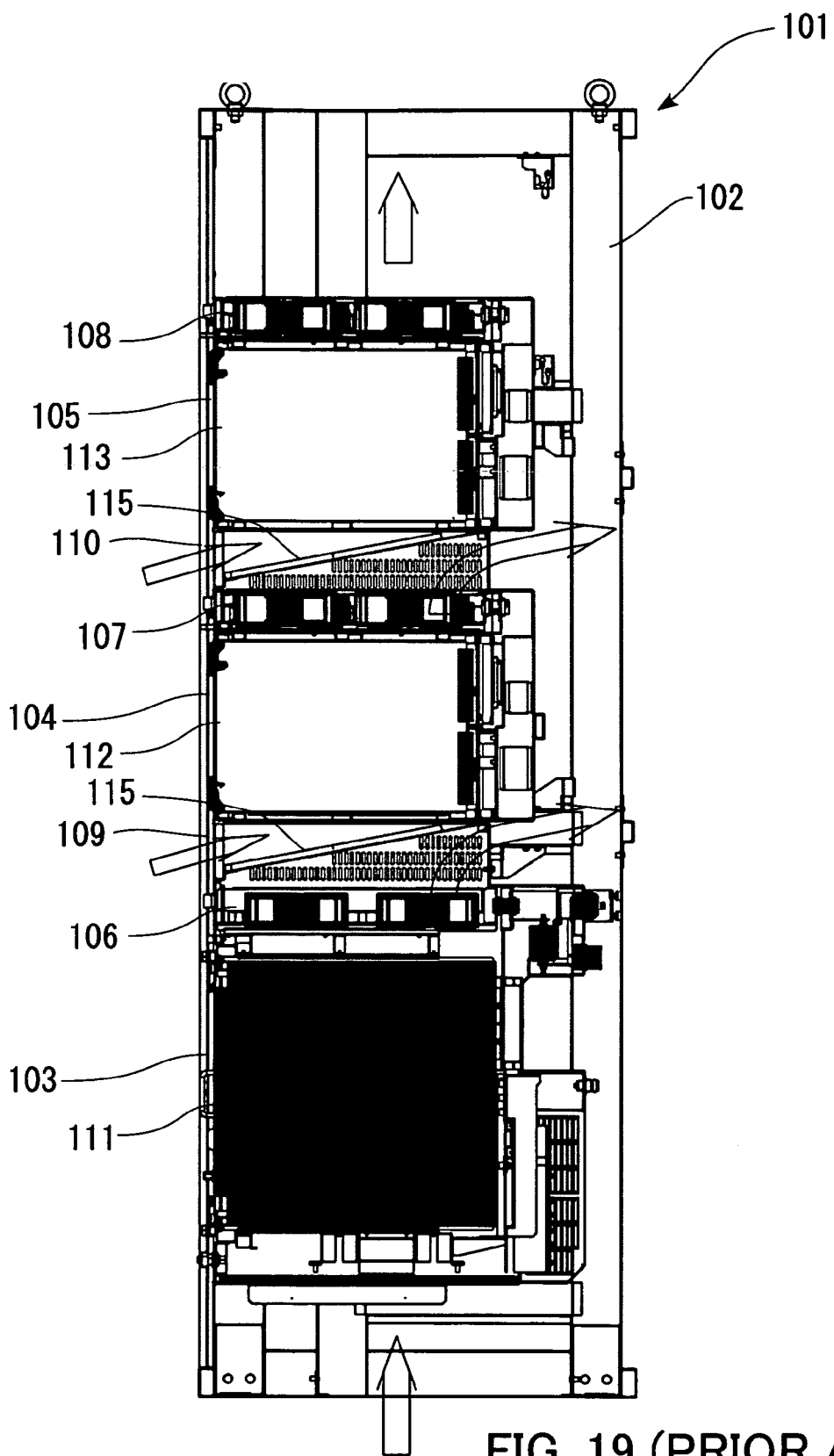
FIG. 19 is a cross-sectional view taken on line A-A of FIG. 17.

As shown in FIGS. 15 and 16, the communication apparatus 501 according to the present embodiment has no fan provided in the top of the uppermost shelf 14 disposed immediately above the heat shield plate 205, similarly to the fourth embodiment. A plurality of printed circuit boards 16 arranged parallel to each other within the shelf 14 are naturally cooled by air introduced from the left and right-side heat-dissipating ducts.

Since the natural cooling is thus employed, to positively introduce air cooled by the left and right-side heat-dissipating ducts into the upper region of the heat shield plate 205, it is preferable to provide a guide that partitions a portion of each heat-dissipating duct close to the heat shield plate 205 to switch the direction of flow of air and thereby guide the air into the right-side opening 5b and the left-side opening 5c of the heat shield plate 205.

In the rack structure of the communication apparatus 501, compared with the second embodiment, since the fan at the highest stage is omitted, the height of the entire apparatus can be made compact accordingly or the resulting available space can be used for other component elements. Further, since the number of fans is reduced, it is possible to reduce noise produced by forced ventilation accordingly.

The present invention is not limitatively applied to communication apparatuses, but it can be applied to any apparatus insofar as it includes shelves for accommodating a plurality of printed circuit boards having electronic components are mounted thereon, parallel to each other, and cools the shelves by forced ventilation.

According to the rack structure according to the present invention, air which is used for cooling in a lower shelf and thereby increased in temperature is cooled when passing through the heat-dissipating ducts, and is used again for cooling an upper shelf. Therefore, heat-dissipating efficiency can be improved. Further, when the rack structure is applied e.g. to a communication apparatus, it is possible to improve the cooling performance thereof within a limited space. Moreover, the necessity of increasing the rotational speed of fans can be reduced, which makes it possible to avoid the problems of noise and the like.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A rack structure formed by arranging a plurality of shelves at respective stages within a rack, each shelf accommodating a plurality of printed circuit boards having electronic components mounted thereon, parallel to each other, in a box-shaped body having openings in a top and a bottom, and disposing, between the plurality of shelves, fans for causing forced ventilation of air from the opening in the bottom to the opening in the top of the shelf immediately below, and heat shield plates each for blocking air delivered from the fans from entering an inside of the shelf immediately above and guiding delivery of the air, comprising:

heat-dissipating walls arranged at sides of the rack to face air delivery openings of the heat shield plates, each of the heat-dissipating walls having a plurality of fins extending vertically, and forming heat-dissipating ducts which extend vertically, between grooves formed between adjacent ones of the fins and associated side walls of the shelves.

2. The rack structure according to claim 1, wherein each of the heat shield plates has a partition plate diagonally partitioning an inside of the box-shaped body, and in a region below the partition plate, air delivered from the fans is guided to a lateral opening to thereby deliver the air into one of the heat-dissipating ducts.

3. The rack structure according to claim 2, wherein said heat-dissipating walls are disposed at lateral sides of the rack, respectively, and at least one of the heat shield plates opens to at least one of the lateral sides of the rack.

4. The rack structure according to claim 2, wherein said heat-dissipating walls are disposed at opposite sides of the rack, and at least one of the partition plates is arranged to direct air delivered thereto to the respective heat-dissipating walls.

5. The rack structure according to claim 1, wherein the fins are formed on at least an inner side of each of the heat-dissipating walls with a wave-like shape which extends vertically.

6. The rack structure according to claim 1, wherein no fan is provided at the top opening of a highest one of the shelves provided at a highest stage of the rack, but the highest shelf is cooled by air naturally drawn in from the heat-dissipating ducts.

7. The rack structure according to claim 2, wherein a region above one of the partition plates which is disposed at an upper location within the rack is formed with an introducing passage for introducing air flowing through the heat-dissipating ducts from the lateral opening, and guiding the air into an immediately upper one of the plurality of shelves.

8. The rack structure according to claim 5, wherein each of said heat-dissipating walls is formed of aluminum.

9. The rack structure according to claim 7, wherein the heat-dissipating ducts are formed with at least one guide for guiding air delivered therein from the lateral opening of at least one of the heat shield plates below, to the lateral opening of at least one of the heat shield plates above.

10. A communication apparatus formed by arranging a plurality of shelves at respective stages within a rack, each shelf accommodating a plurality of printed circuit boards having communication electronic components mounted thereon, parallel to each other, in a box-shaped body having openings in a top and a bottom, and disposing, between the plurality of shelves, fans for causing forced ventilation of air from the opening in the bottom to the opening in the top of the shelf immediately below, and heat shield plates each for blocking air delivered from the fans from entering an inside of the shelf immediately above and guiding delivery of the air, comprising:

heat-dissipating walls arranged at sides of the rack to face air delivery openings of the heat shield plates, each of the heat-dissipating walls having a plurality of fins extending vertically, and forming heat-dissipating ducts which extend vertically, between grooves formed between adjacent ones of the fins and associated side walls of the shelves.

11. The communication apparatus according to claim 10, wherein each of the heat shield plates has a partition plate diagonally partitioning an inside of the box-shaped body, and in a region below the partition plate, air delivered from the fans is guided to a lateral opening to thereby deliver the air into one of the heat-dissipating ducts.

12. The communication apparatus according to claim 11, wherein said heat-dissipating walls are disposed at lateral sides of the rack, respectively, and at least one of the heat shield plates opens to at least one of the lateral sides of the communication apparatus.

13. The communication apparatus according to claim 11, wherein said heat-dissipating walls are disposed at opposite sides of the rack, and at least one of the partition plates is arranged to direct air delivered thereto to the respective heat-dissipating walls.

14. The communication apparatus according to claim 10, wherein the fins are formed on at least an inner side of each of the heat-dissipating walls with a wave-like shape which extends vertically.

15. The communication apparatus according to claim 10, wherein no fan is provided at the top opening of a highest one of the shelves provided at a highest stage of the rack, but the highest shelf is cooled by air naturally drawn in from the heat-dissipating ducts.

16. The communication apparatus according to claim 11, wherein a region above one of the partition plates which is disposed at an upper location within the rack is formed with an introducing passage for introducing air flowing through the heat-dissipating ducts from the lateral opening, and guiding the air into an immediately upper one of the plurality of shelves.

17. The communication apparatus according to claim 14, wherein each of said heat-dissipating walls is formed of aluminum.

18. The communication apparatus according to claim 16, wherein the heat-dissipating ducts are formed with at least one guide for guiding air delivered therein from the lateral opening of at least one of the heat shield plates below, to the lateral opening of at least one of the heat shield plates above.

19. The rack structure according to claim 1, wherein the fins are formed linear and parallel on inner and outer sides of each of the heat dissipating walls.

20. The rack structure according to claim 5, wherein the fins are formed linear and parallel on an outer side of each of the heat dissipating walls.

21. The communication apparatus according to claim 10, wherein the fins are formed linear and parallel on inner and outer sides of each of the heat dissipating walls.

22. The communication apparatus according to claim 14, wherein the fins are formed linear and parallel on an outer side of each of the heat dissipating walls.

23. The rack structure according to claim 4, wherein the at least one of the partition plates is in a V-shape.

24. The communication apparatus according to claim 13, wherein the at least one of the partition plates is in a V-shape.

25. The rack structure according to claim 1, wherein at least one partition is provided in the heat dissipating ducts to at least partially prevent air outside the rack structure from entering the heat dissipating ducts.

26. The communication apparatus according to claim 10 wherein at least one partition is provided in the heat dissipating ducts to at least partially prevent air outside the communication apparatus from entering the heat dissipating ducts.

27. The rack structure as recited in claim 5, wherein the wave-like shape is selected from a triangular wave and a sine wave.

28. The communication apparatus according to claim 14, wherein the wave-like shape is selected from a triangular wave and a sine wave.

* * * * *